United States Patent
Lin et al.

(10) Patent No.: US 11,145,674 B1
(45) Date of Patent: Oct. 12, 2021

(54) 3D MEMORY DEVICE AND METHOD OF MANUFACTURING THE SAME

(71) Applicant: MACRONIX International Co., Ltd., Hsinchu (TW)

(72) Inventors: Wei-Liang Lin, Taipei (TW); Wen-Jer Tsai, Hualien County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/841,700

(22) Filed: Apr. 7, 2020

(51) Int. Cl.
| | |
|---|---|
| *H01L 27/11582* | (2017.01) |
| *H01L 27/11521* | (2017.01) |
| *H01L 27/11556* | (2017.01) |
| *H01L 29/423* | (2006.01) |
| *H01L 21/265* | (2006.01) |
| *H01L 27/11568* | (2017.01) |
| *H01L 21/28* | (2006.01) |
| *H01L 21/02* | (2006.01) |

(52) U.S. Cl.
CPC .. *H01L 27/11582* (2013.01); *H01L 21/02236* (2013.01); *H01L 21/26513* (2013.01); *H01L 27/11521* (2013.01); *H01L 27/11556* (2013.01); *H01L 27/11568* (2013.01); *H01L 29/40114* (2019.08); *H01L 29/40117* (2019.08); *H01L 29/4234* (2013.01); *H01L 29/42324* (2013.01)

(58) Field of Classification Search
CPC ........ H01L 27/11582; H01L 27/11556; H01L 27/11521; H01L 29/42324; H01L 29/4234; H01L 21/02236; H01L 27/11568; H01L 29/40114; H01L 21/26513; H01L 29/40117
See application file for complete search history.

(56) References Cited

U.S. PATENT DOCUMENTS

| 10,559,580 B2 | 2/2020 | Son et al. |
| 2010/0117138 A1 | 5/2010 | Huerta et al. |

(Continued)

FOREIGN PATENT DOCUMENTS

| TW | 201232538 | 8/2012 |
| TW | 201711138 | 3/2017 |
| TW | I668846 | 8/2019 |

OTHER PUBLICATIONS

"Office Action of Taiwan Counterpart Application", dated Feb. 3, 2021, pp. 1-7.

*Primary Examiner* — Mohammed R Alam
(74) *Attorney, Agent, or Firm* — J.C. Patents

(57) ABSTRACT

A 3D memory device includes a substrate, stacked structures formed on the substrate, common source line (CSL) contacts, and NOR flash memories. The substrate has CSLs and memory cell regions alternately arranged along one direction in parallel. The stacked structures are located on the memory cell regions and include a ground select line (GSL) layer and a word line (WL) layer. The CSL contacts are disposed along another direction to connect the CSLs. The NOR flash memories are disposed in the memory cell regions, and each of the NOR flash memories includes at least an epitaxial pillar through the stacked structure, a charge-trapping layer located between the epitaxial pillar and the WL layer, and a high-k layer located between the charge-trapping layer and the WL layer. The epitaxial pillar has a retracted sidewall at a position passing through the GSL layer.

10 Claims, 25 Drawing Sheets

(56) References Cited

U.S. PATENT DOCUMENTS

| | | | |
|---|---|---|---|
| 2017/0221813 A1* | 8/2017 | Kim | ................ H01L 27/11582 |
| 2018/0261616 A1 | 9/2018 | Cho et al. | |
| 2020/0161328 A1* | 5/2020 | Yoon | ................ H01L 45/1226 |

* cited by examiner

3D MEMORY DEVICE AND METHOD OF MANUFACTURING THE SAME

BACKGROUND

Technical Field

The disclosure relates to a 3D memory device and a method of manufacturing the same.

Description of Related Art

In the manufacture of high-density memory devices, the amount of data per unit area in integrated circuits has become a key factor. In particular, in order to achieve a competitive bit cost, the unit size of each bit is continuously shrinking, but it is still insufficient for the conventional planar NOR flash memory array structure. In particular for 2T-NOR flash memories in low Vcc/power applications, the requirement is a select transistor with a low threshold voltage (Vt) immune to punch through.

Since the reduction in the size of planar memory cells is achieved by reducing the gate length of the memory cells, once the gate length becomes smaller, the channel length is shortened, and abnormal punch through phenomenon readily occurs between the drain region and the source region, thus seriously affecting the electrical performance of the memory cells and causing misjudgment of data.

SUMMARY

The disclosure provides a 3D memory device that may simultaneously achieve the effects of reducing the area of memory cells and preventing the occurrence of punch through phenomenon.

The disclosure also provides a method of manufacturing a 3D memory device that may manufacture a NOR flash memory with a high density of memory cells and punch through resistance.

The 3D memory device of the disclosure includes a substrate, a plurality of stacked structures, a plurality of common source line (CSL) contacts, and a plurality of NOR flash memories. The substrate has a plurality of CSLs and a plurality of memory cell regions alternately arranged along a first direction in parallel. The stacked structures are formed on the plurality of memory cell regions of the substrate, and each of the stacked structures includes a ground select line (GSL) layer electrically isolated from the substrate and a word line (WL) layer electrically isolated from the GSL layer and formed thereon. The plurality of CSL contacts are formed on the plurality of CSLs of the substrate along a second direction to connect each of the CSLs. The NOR flash memories pass through the stacked structures and are disposed in the plurality of memory cell regions, and each of the NOR flash memories includes an epitaxial pillar, a charge-trapping layer, a high-k layer, and a first insulating layer. The epitaxial pillar is formed from the substrate, and a portion of the epitaxial pillar has a retracted sidewall at a portion passing through the GSL layer. The charge-trapping layer is located between the epitaxial pillar and the WL layer in the stacked structure, and the high-k layer is located between the charge-trapping layer and the WL layer. The first insulating layer is located between the retracted sidewall of the epitaxial pillar and the GSL layer.

In an embodiment of the disclosure, each of the CSL contacts is in direct contact with the CSLs.

In an embodiment of the disclosure, the charge-trapping layer surrounds the epitaxial pillar and may be extended to an upper surface and a lower surface of the WL layer.

In an embodiment of the disclosure, the 3D memory device may further include a second insulating layer formed between the CSL contacts and the stacked structures.

In an embodiment of the disclosure, the 3D memory device may further include a plurality of first conductivity type doped regions formed in a top surface of the epitaxial pillar.

In an embodiment of the disclosure, the 3D memory device may further include a plurality of second conductivity type doped regions formed in the substrate under the epitaxial pillar.

In an embodiment of the disclosure, the substrate is a silicon substrate, and the epitaxial pillar is a silicon epitaxial pillar.

The method of manufacturing a 3D memory device of the disclosure includes the following steps. A substrate having a plurality of CSL regions and a plurality of memory cell regions alternately arranged along a first direction in parallel is provided. Next, a stacked structure is formed on the substrate, wherein the stacked structure includes N+1 layers of a first material layer and N layers of a second material layer alternated with each other, and N is an integer greater than 1. A plurality of through holes are formed in the stacked structure on the memory cell regions until the substrate is exposed, and then a plurality of epitaxial pillars are grown from the substrate through the through holes. A plurality of first slits are formed in the stacked structure on the CSL regions and a topmost second material layer is exposed, wherein each of the first slits is aligned with each of the CSL regions. The topmost second material layer is first completely removed to form a first space exposing a portion of each of the epitaxial pillars, and then a charge-trapping layer is conformally deposited on a surface of the first slits and a surface of each of the epitaxial pillars exposed. Next, a plurality of second slits exposing the plurality of CSL regions are formed under the first slits, and a bottommost second material layer is exposed. The bottommost second material layer is completely removed to form a second space exposing another portion of each of the epitaxial pillars, and then a thermal oxidation method is performed to form a thermal oxidation layer on the surface of each of the epitaxial pillars exposed and a surface of the CSL regions. A high-k layer is deposited on a surface of the thermal oxidation layer and a surface of the charge-trapping layer exposed in the first space and the second space, and then a metal material is deposited in the first space and the second space. Then, a plurality of third slits cutting off the metal material are formed at positions of the original first slits and second slits, and the substrate is exposed, wherein the metal material left in the first space is used as a WL, and the metal material left in the second space is used as a GSL. An ion implantation process is performed to form a plurality of CSLs in the exposed substrate. Then, an insulating layer is deposited in the third slits, and then a plurality of CSL contacts are formed in the insulating layer along a second direction to connect the plurality of CSLs, respectively.

Based on the above, in the disclosure, the memory array is changed into a 3D device, which may not only reduce the area of the memory cells, but a high-k layer may also be added as a blocking oxide and a bandgap engineered tunnel oxide in the NOR flash memories via process improvements, and memory performance may be improved using a metal gate (WL). In addition, the manufacturing method of the disclosure may provide a high-quality insulating layer between the GSL and the epitaxial channel to prevent the occurrence of punch through phenomenon.

It is to be understood that both the foregoing general description and the following detailed description are exemplary, and are not intended to limit the scope of the disclosure.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
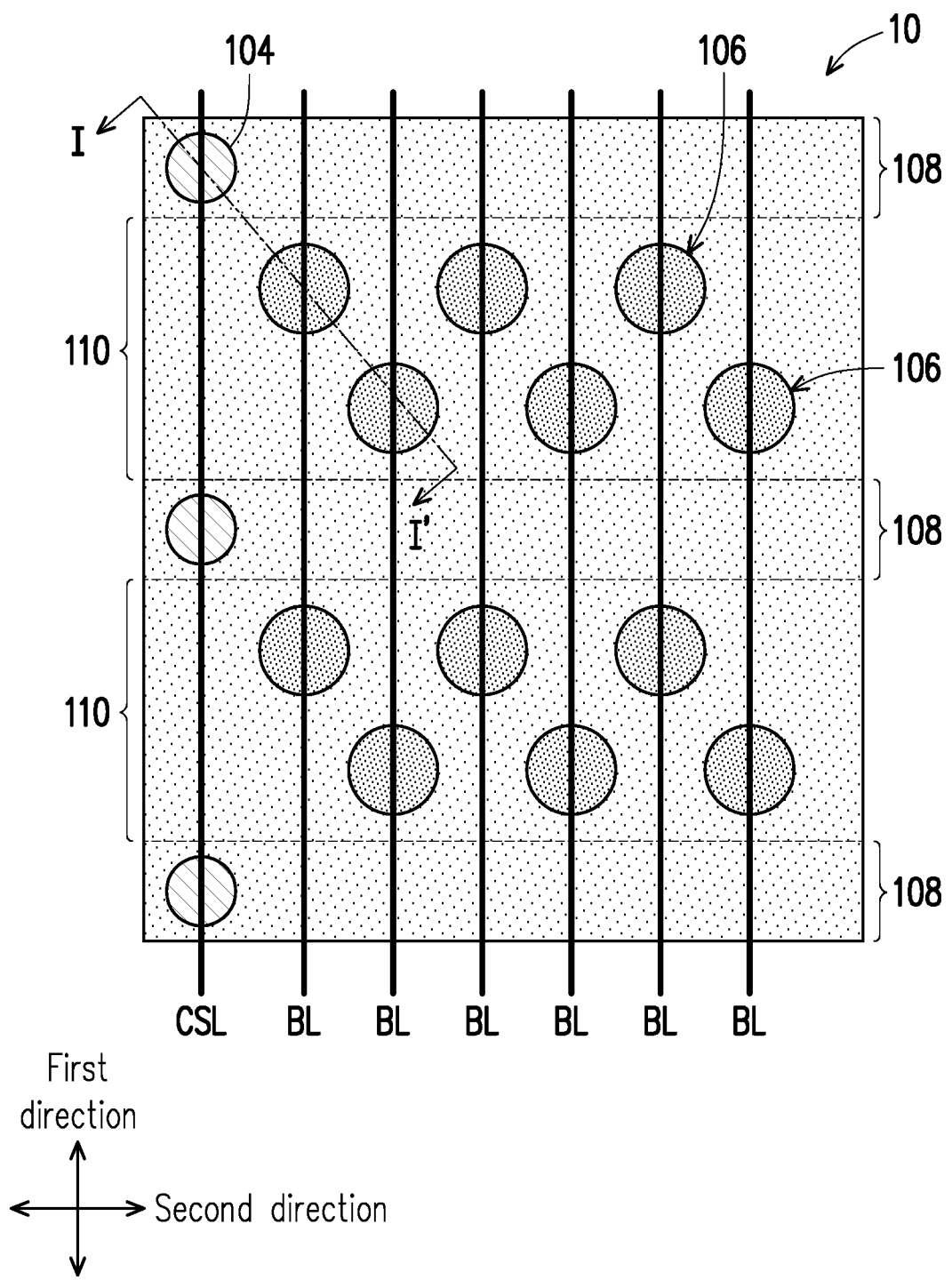
FIG. 1 is a top view of a 3D memory device according to the first embodiment of the disclosure.

The disclosure below provides numerous different embodiments or examples for implementing different features of the disclosure. Moreover, these embodiments are merely exemplary and are not intended to limit the scope and application of the disclosure. Furthermore, for the sake of clarity, the relative dimensions (such as length, thickness, pitch, etc.) and relative positions of each region or structural element may be reduced or enlarged. Moreover, similar or the same reference numerals are used in each figure to represent similar or the same elements or features.

Figure 2:
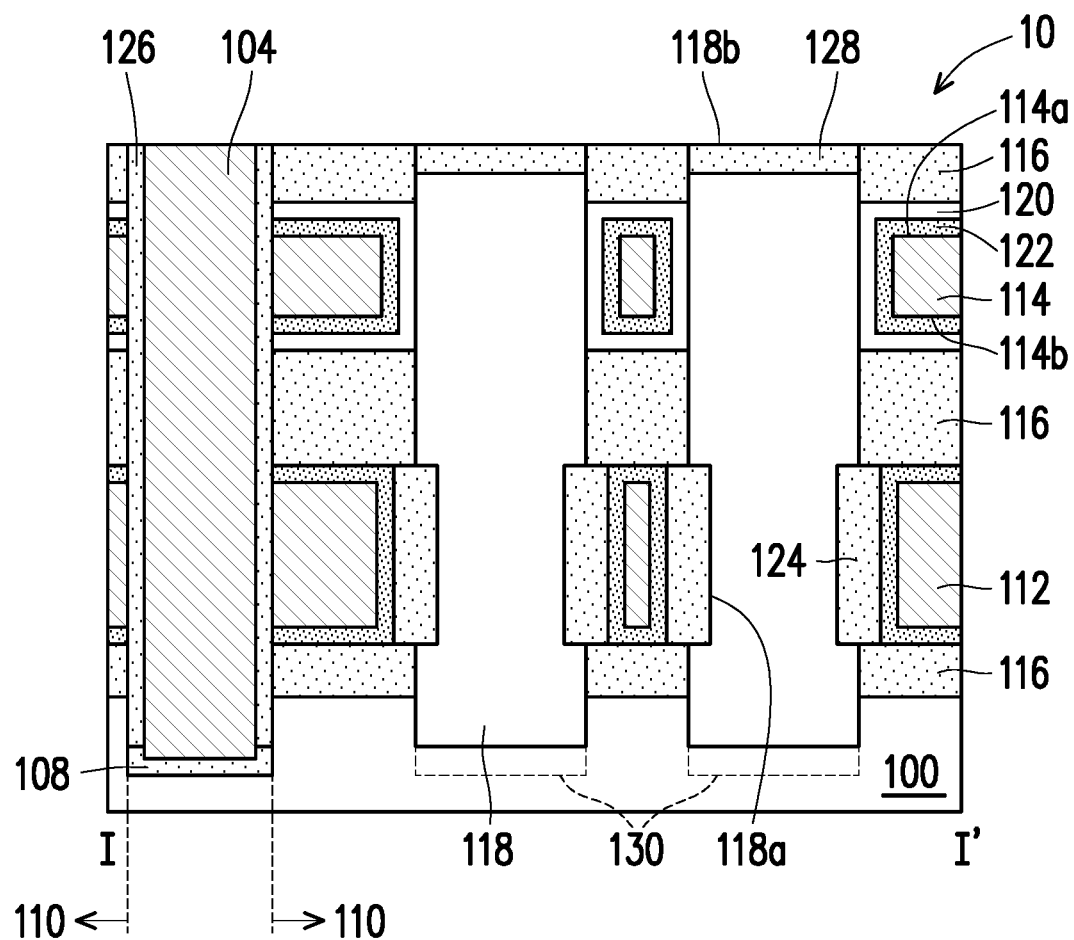
FIG. 2 is a cross-sectional view along section line I-I' of FIG. 1.

FIG. 1 is a top view of a 3D memory device according to the first embodiment of the disclosure, and FIG. 2 is a cross-sectional view along section line I-I' of FIG. 1.

Please refer to FIG. 1 and FIG. 2 at the same time. A 3D memory device 10 of the first embodiment includes a substrate 100, a plurality of stacked structures 102, a plurality of common source line (CSL) contacts 104, and a plurality of NOR flash memories 106. The substrate 100 has a plurality of CSLs 108 and a plurality of memory cell regions 110 alternately arranged along a first direction in parallel. The stacked structures 102 are formed on the plurality of memory cell regions 110 of the substrate 100, and each of the stacked structures 102 includes a ground select line (GSL) layer 112 electrically isolated from the substrate 100 and a word line (WL) layer 114 electrically isolated from the GSL layer 112 and formed thereon. In more detail, each of the stacked structures 102 is formed by at least three insulating layers 116 and the GSL layer 112 and the WL layer 114, and electrical isolation of the GSL layer 112 and the WL layer 114 is achieved by the insulating layers 116. In an embodiment, the GSL layer 112 and the WL layer 114 are both metal materials (such as tungsten); in another embodiment, the GSL layer 112 is polysilicon and the WL layer 114 is a metal material (such as tungsten). The CSL contacts 104 are formed on the plurality of CSLs 108 of the substrate 10 along a second direction to connect each of the CSLs 108, and the CSL contacts 104 and the CSLs 108 may be in direct contact. In the present embodiment, the first direction is perpendicular to the second direction. However, the disclosure is not limited thereto, and there may be an angle (such as an acute angle) between the first direction and the second direction. A plurality of bit lines BL may be arranged parallel to the second direction and electrically coupled to the NOR flash memories 106 below, and the CSL contacts 104 are externally connected via the same circuit CSL.

Figure 3:
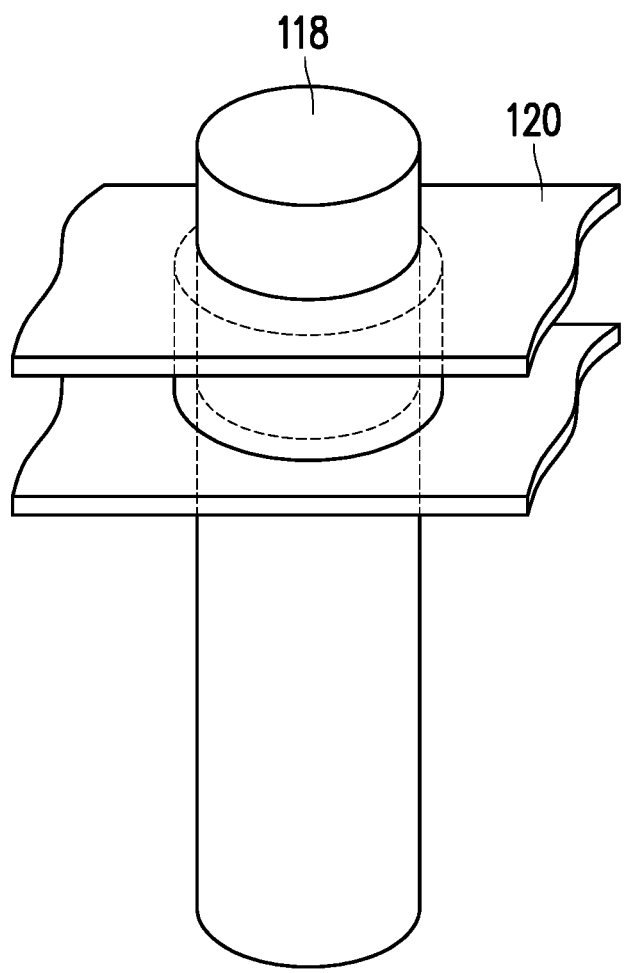
FIG. 3 is a perspective view of an epitaxial pillar and a charge-trapping layer in FIG. 2.

Please continue to refer to FIG. 2. The NOR flash memories 106 in the first embodiment pass through the stacked structures 102 and are disposed in the memory cell regions 110, and each of the NOR flash memories 106 includes at least an epitaxial pillar 118, a charge-trapping layer 120, a high-k layer 122, and a first insulating layer 124. The epitaxial pillar 118 is formed from the substrate 100, wherein the substrate 100 is a silicon substrate and the epitaxial pillar 118 is a silicon epitaxial pillar, which is different from the traditional element channel formed by polysilicon, and has higher mobility that improve device performance, and the epitaxial pillar 118 has a retracted sidewall 118a at a portion passing through the GSL layer 112. That is, if the cross-sectional shape of the epitaxial pillar 118 is a circle, then the diameter of the portion passing through the GSL layer 112 is smaller than the diameter of other portions because the first insulating layer 124 isolates the epitaxial pillar 118 and the GSL layer 112 here, and the first insulating layer 124 may be a thermal oxidation layer formed by a thermal oxidation method. However, the disclosure is not limited thereto, and the cross-sectional shape of the epitaxial pillar 118 may be an oval, a square, a polygon, or a combination thereof. The charge-trapping layer 120 is located between the epitaxial pillar 118 and the WL layer 114 in the stacked structures 102. For example, the position of the charge-trapping layer 120 may surround the epitaxial pillar 118 and be extended to the upper surface 114a and the lower surface 114b of the WL layer 114. Therefore, the structure of the charge-trapping layer 120 is as shown in FIG. 3 which is a perspective view of the epitaxial pillar 118 and the charge-trapping layer 120. In an embodiment, the charge-trapping layer 120 is, for example, an ONO layer or an ONONO layer. The high-k layer 122 is located between the charge-trapping layer 120 and the WL layer 114. In an embodiment, the material of the high-k layer 122 is, for example, hafnium dioxide ($HfO_2$), titanium dioxide ($TiO_2$), zirconium dioxide ($ZrO_2$), tantalum oxide ($Ta_2O_5$), or aluminum oxide ($Al_2O_3$). In addition, in the present embodiment, a second insulating layer 126 is provided between the CSL contacts 104 and the stacked structures 102 as an electrical isolation structure.

In FIG. 2, the 3D memory device 10 further includes a first conductivity type doped region 128 formed in a top surface 118b of the epitaxial pillar 118, and the first conductivity type doped region 128 and the CSL 108 may have the same conductivity type. In addition, a second conductivity type doped region 130 may be formed in the substrate 100 under the epitaxial pillar 118, which may adjust the threshold voltage (Vt) of the GSL layer 112 so that the Vt of the GSL becomes small and has a very high narrow Vt distribution. In an embodiment, the first conductive type is n type, and the second conductive type is p type. In another embodiment, the first conductive type is p type, and the second conductive type is n type.

Figure 4:
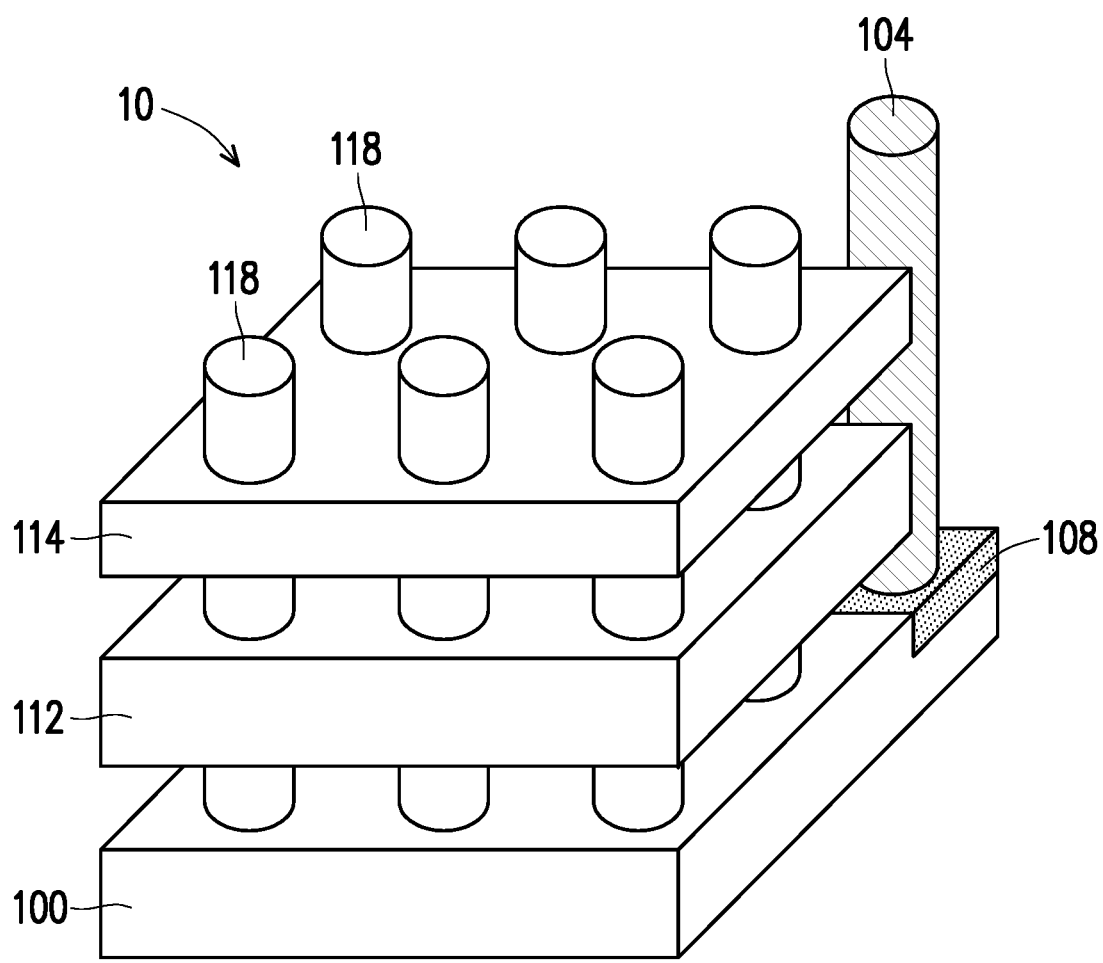
FIG. 4 is a perspective sketch of a 3D memory device of the first embodiment.

In order to understand the structure of the 3D memory device of the disclosure more clearly, please refer to FIG. 4, wherein only the WL layer 114, the GSL layer 112, the substrate 100, the epitaxial pillar 118, the CSLs 108, and the CSL contacts 104 of the first embodiment are shown. It may be observed from FIG. 4 that the epitaxial pillar 118 representing the element channel is surrounded by the WL layer 114, so the 3D memory device 10 of the disclosure belongs to a GAA (Gate-all-around) element, and therefore has better gate controllability and better device performance.

Figure 5A:
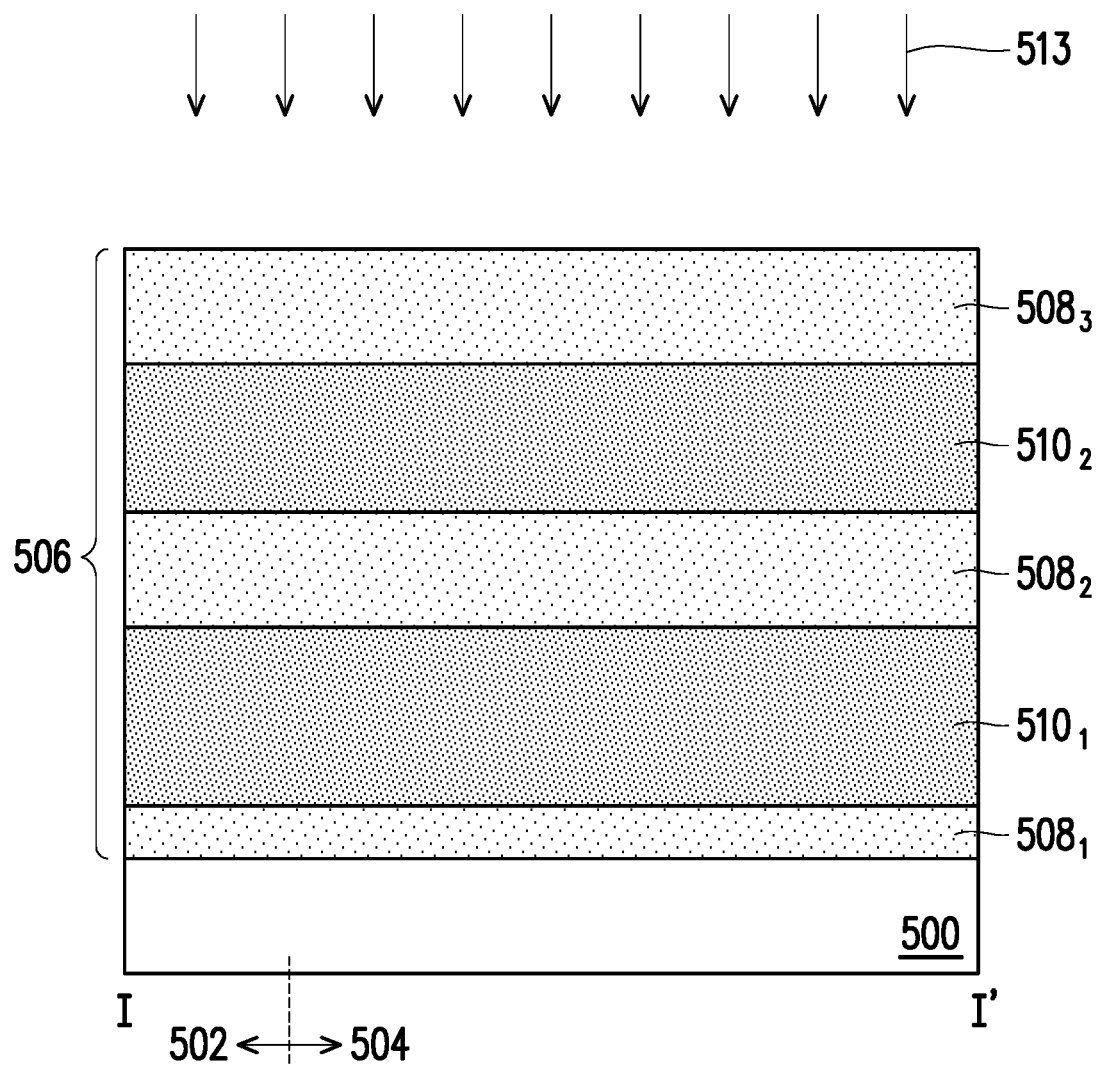
FIG. 5A to FIG. 5R are cross-sectional views of a manufacturing process of a 3D memory device according to the second embodiment of the disclosure.
Figure 5B:
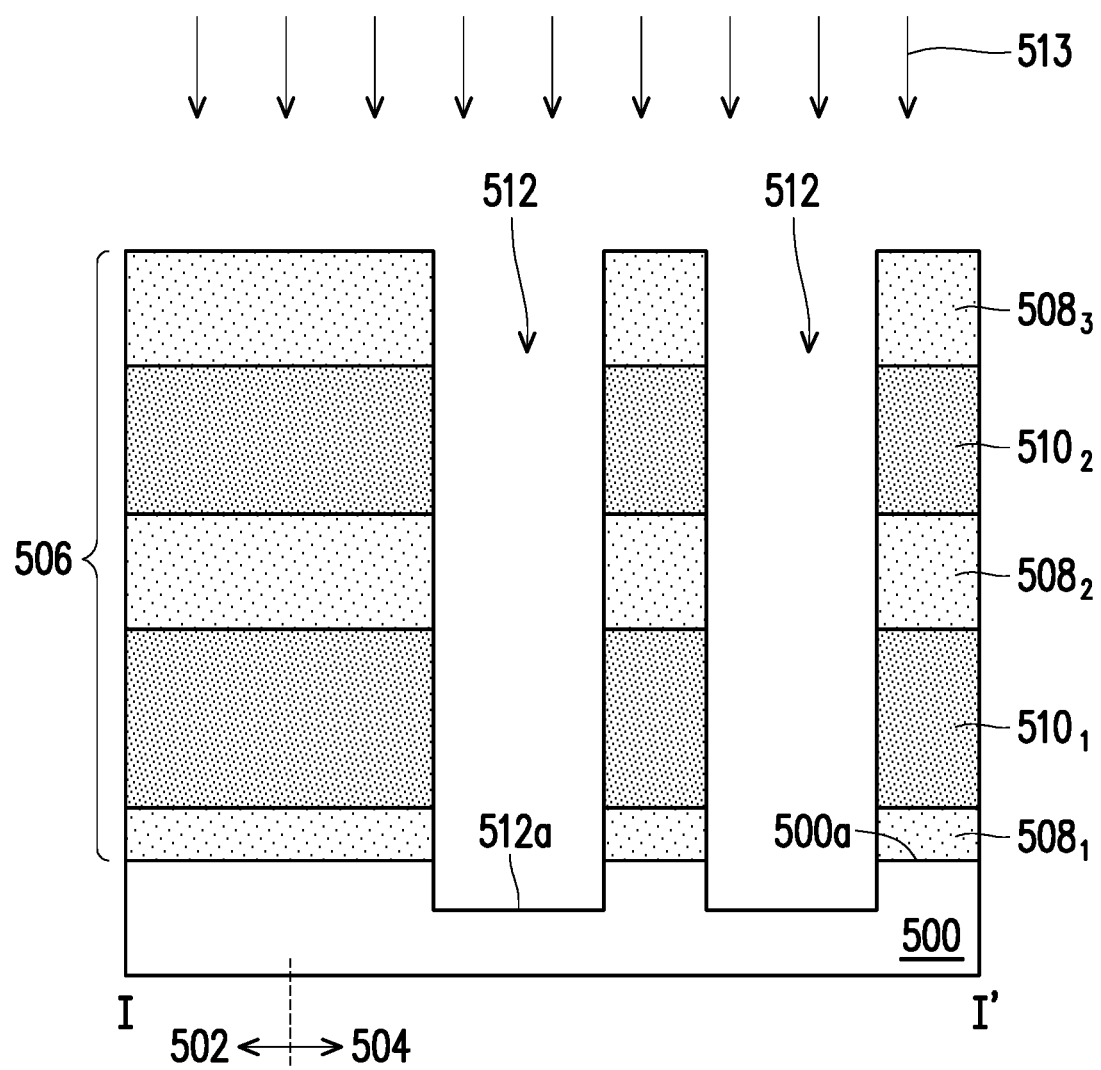
Figure 5C:
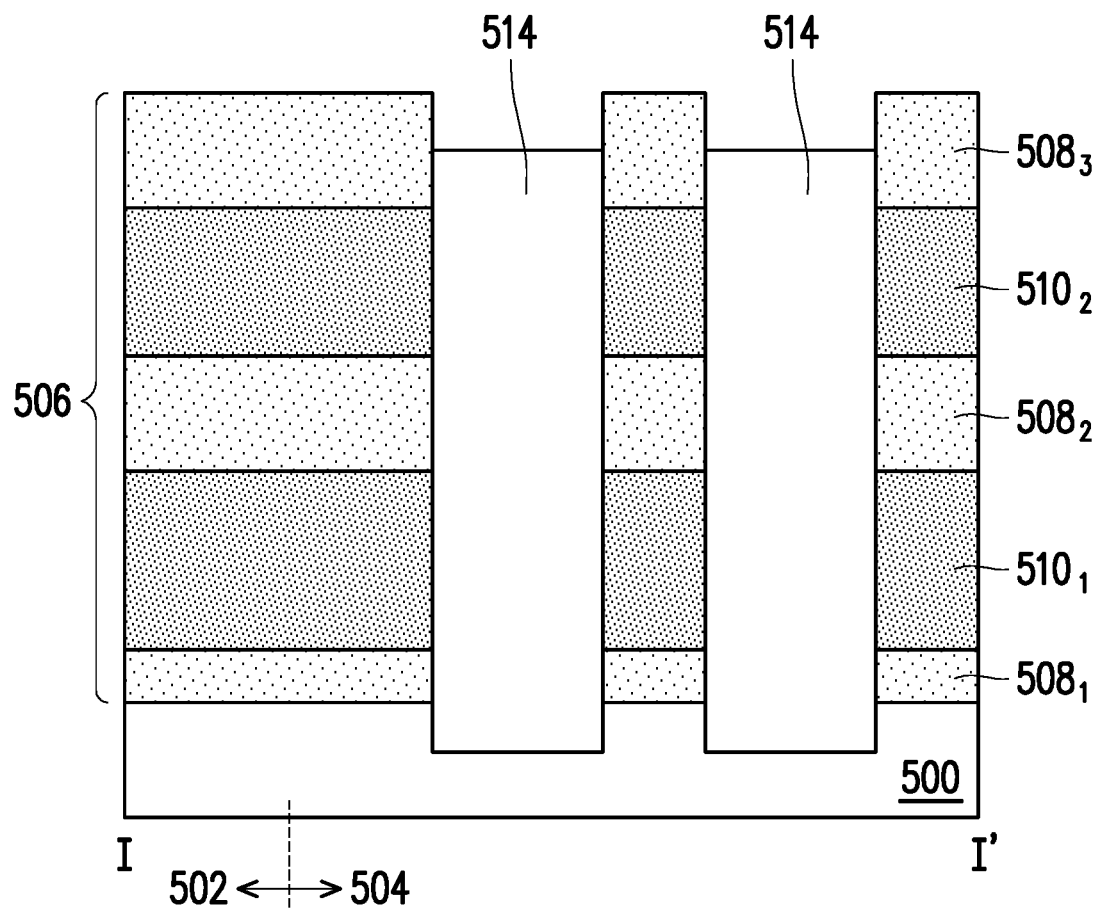
Figure 5D:
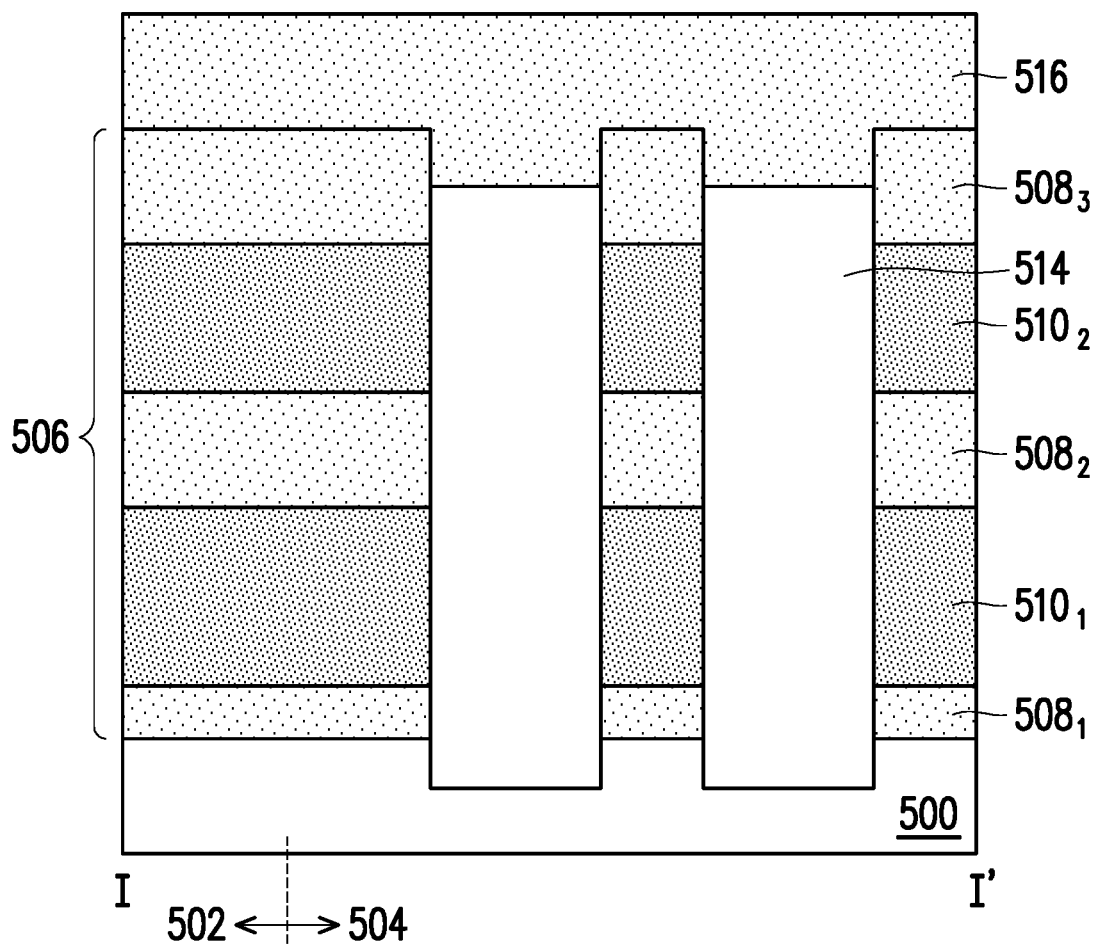
Figure 5E:
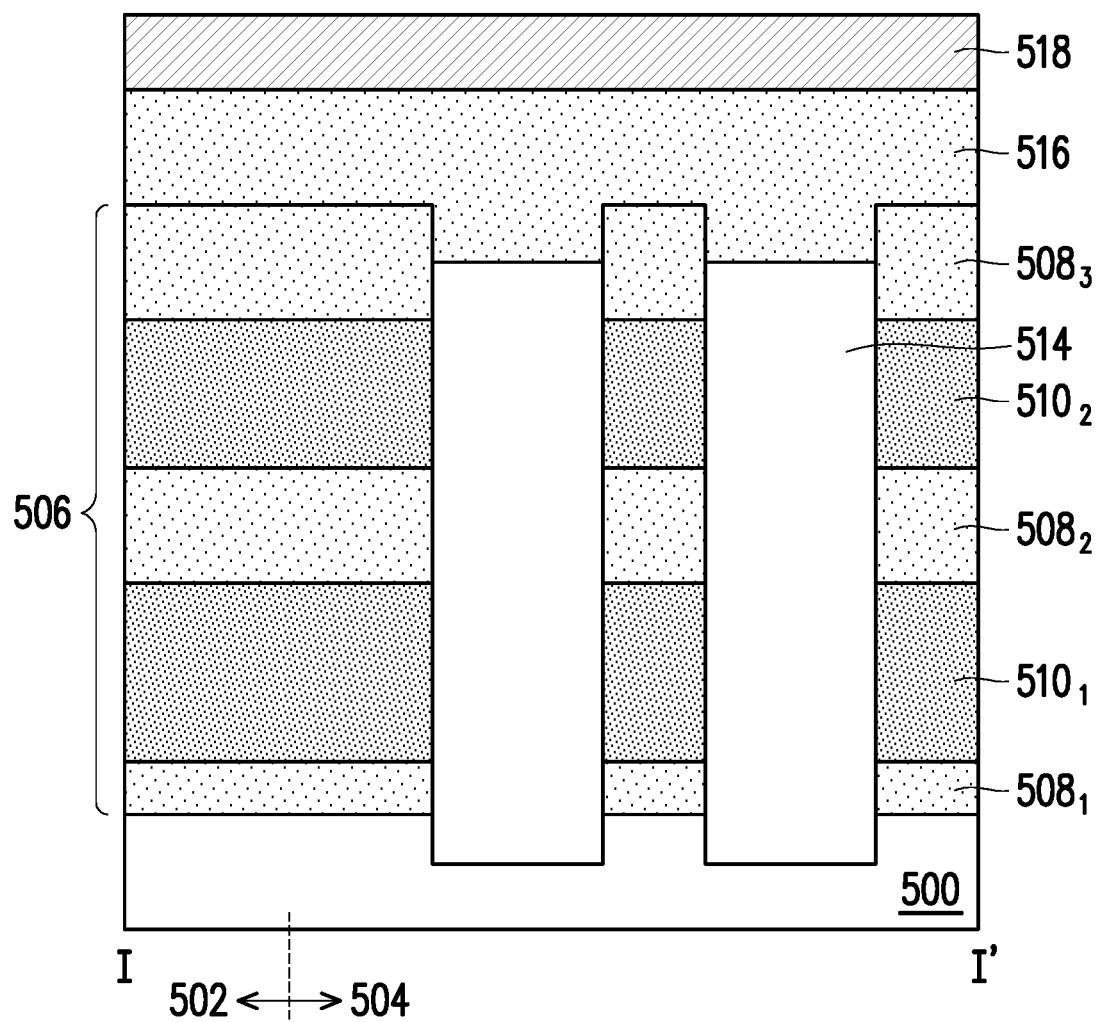
Figure 5F:
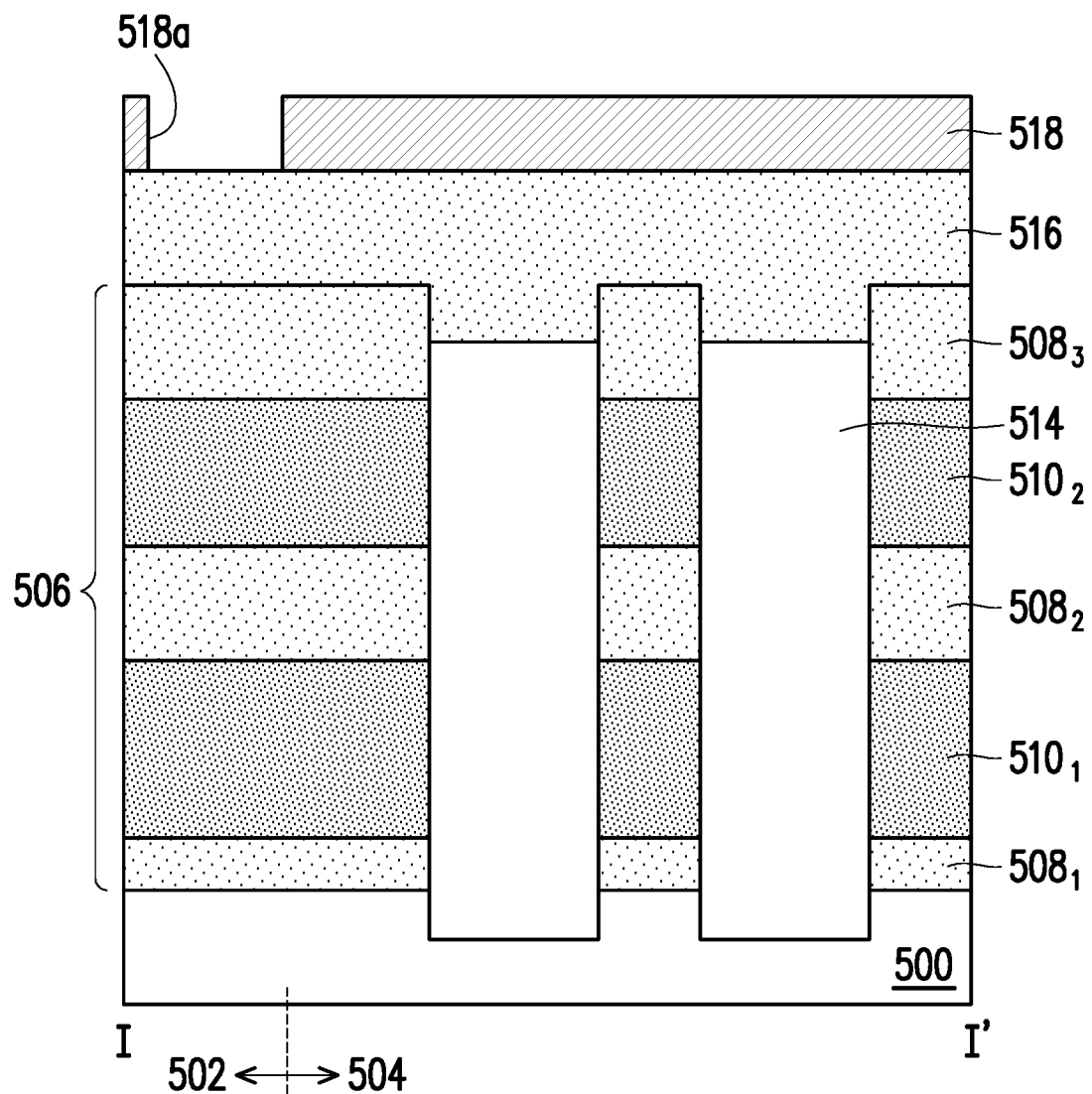
Figure 5G:
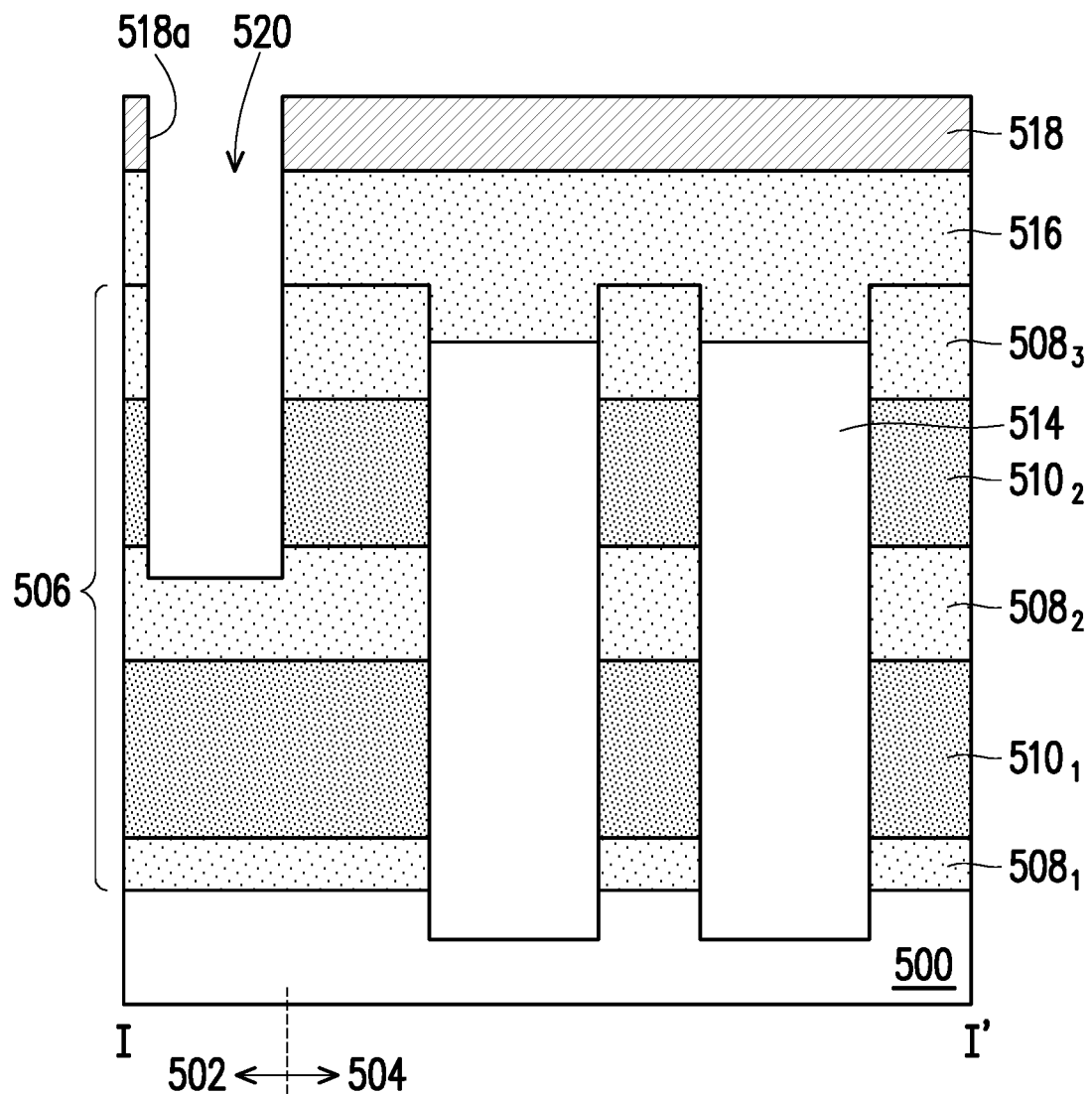
Figure 5H:
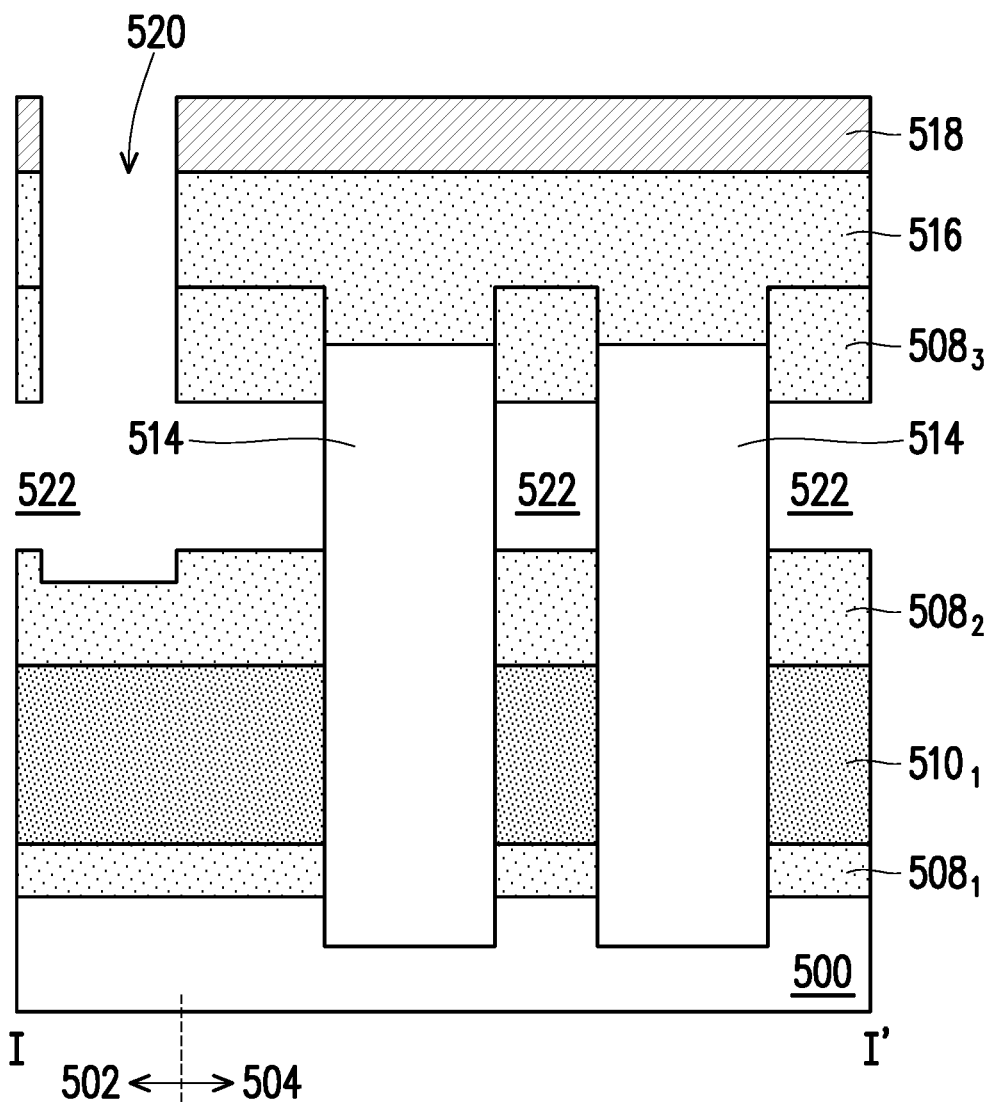
Figure 5I:
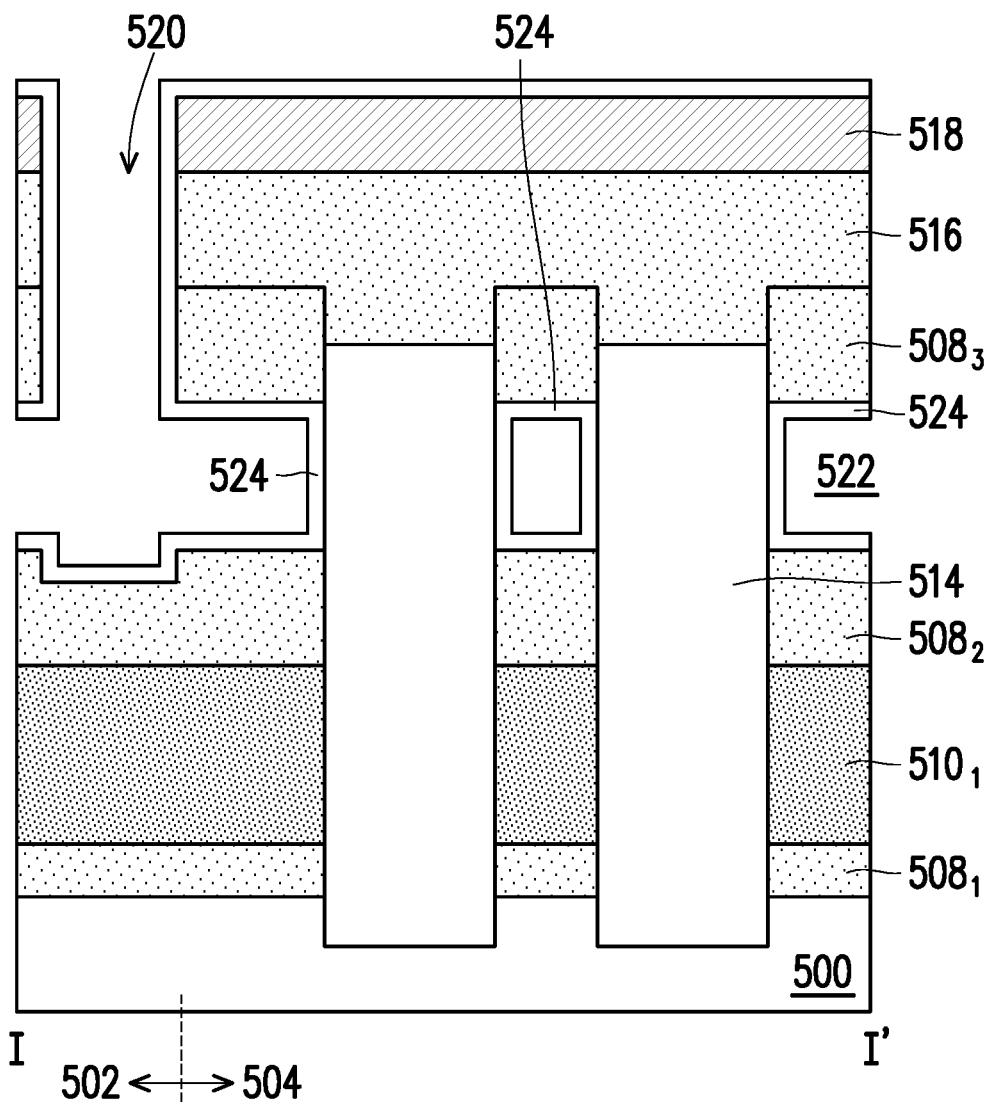
Figure 5J:
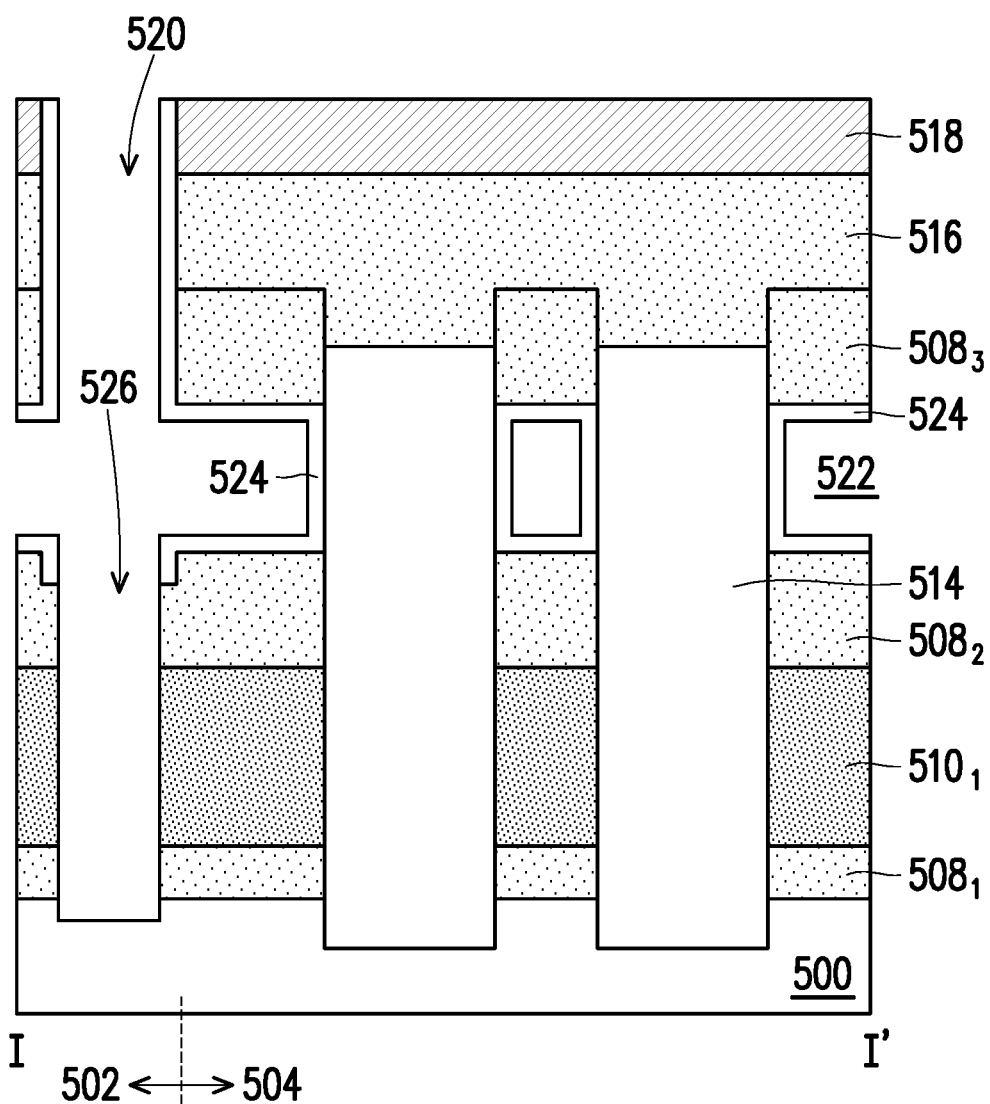
Figure 5K:
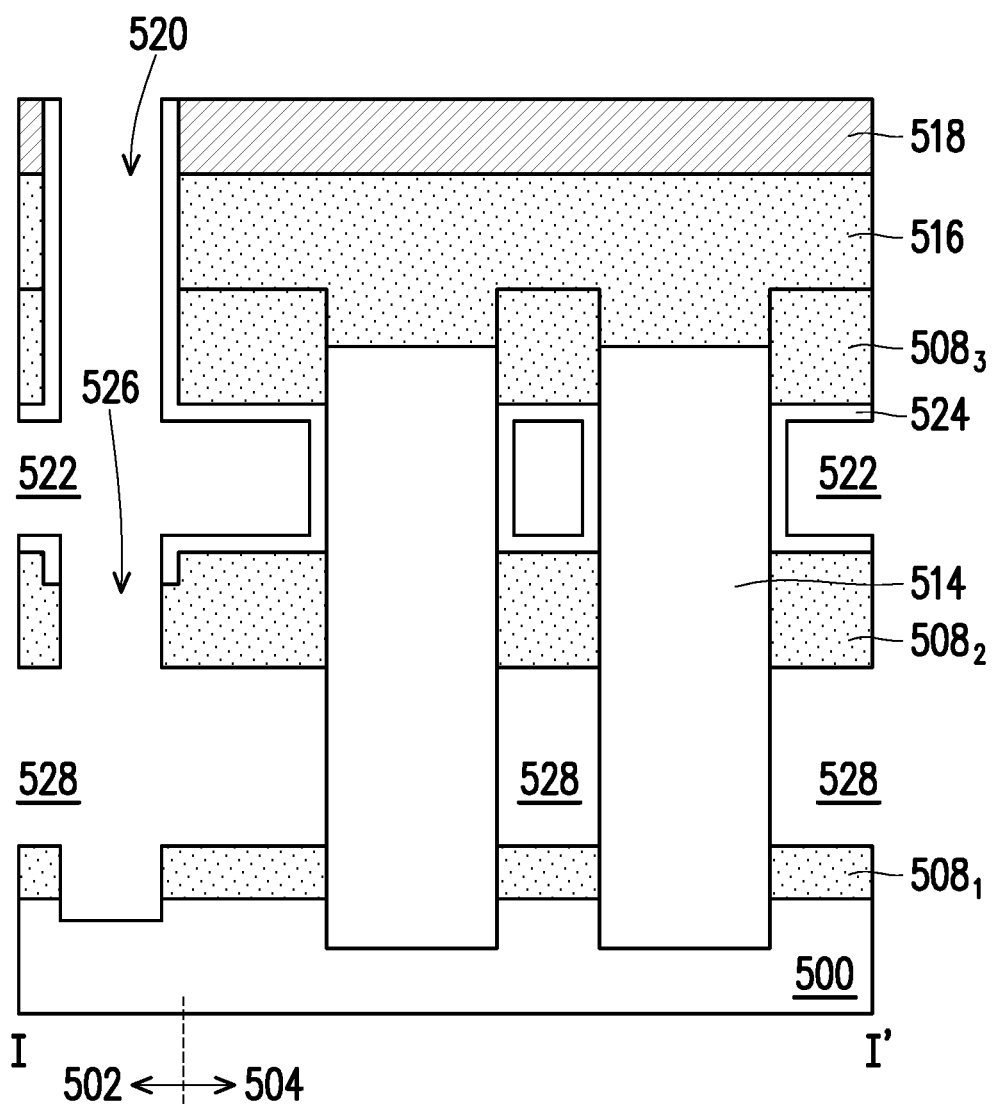
Figure 5L:
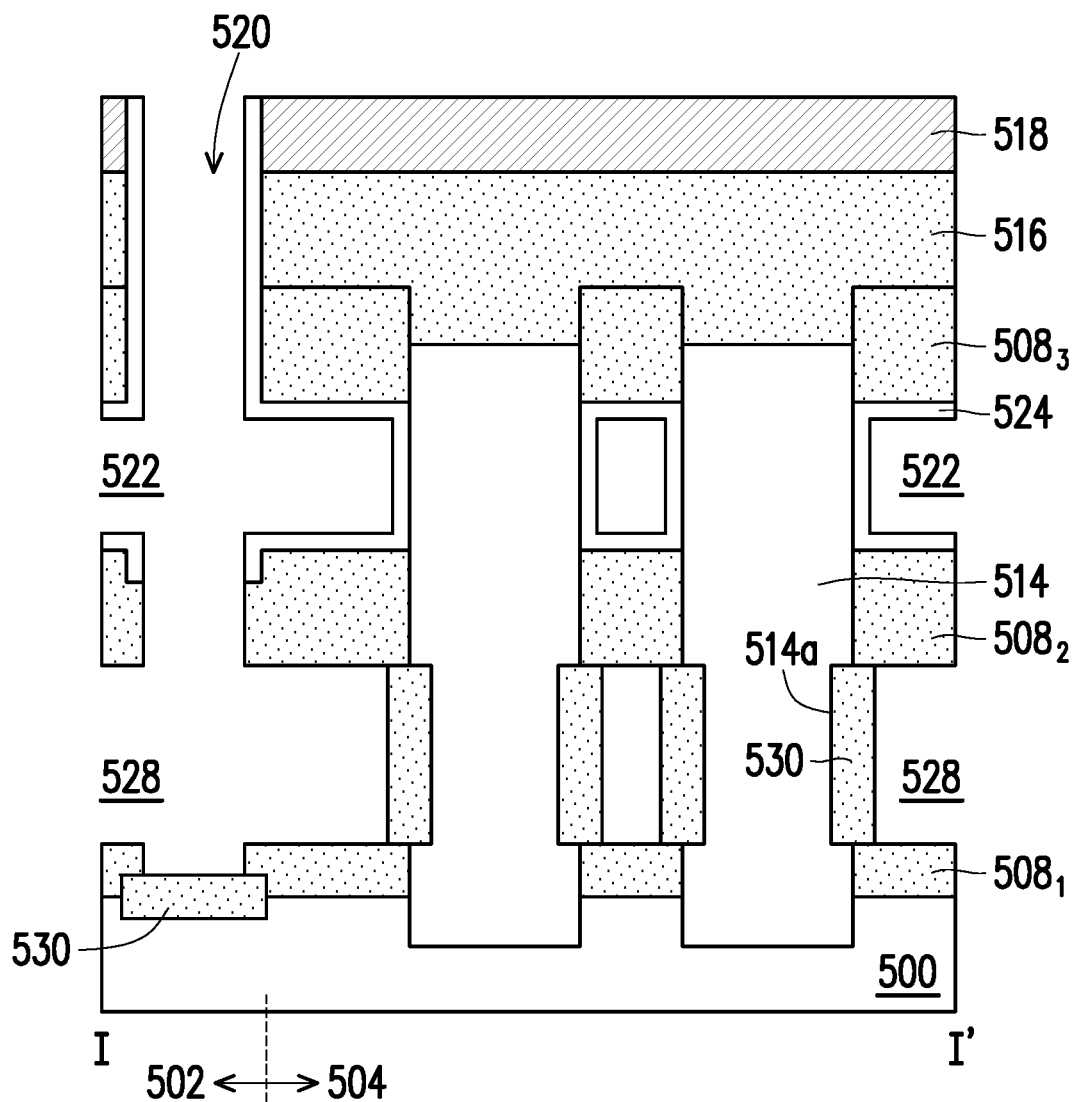
Figure 5M:
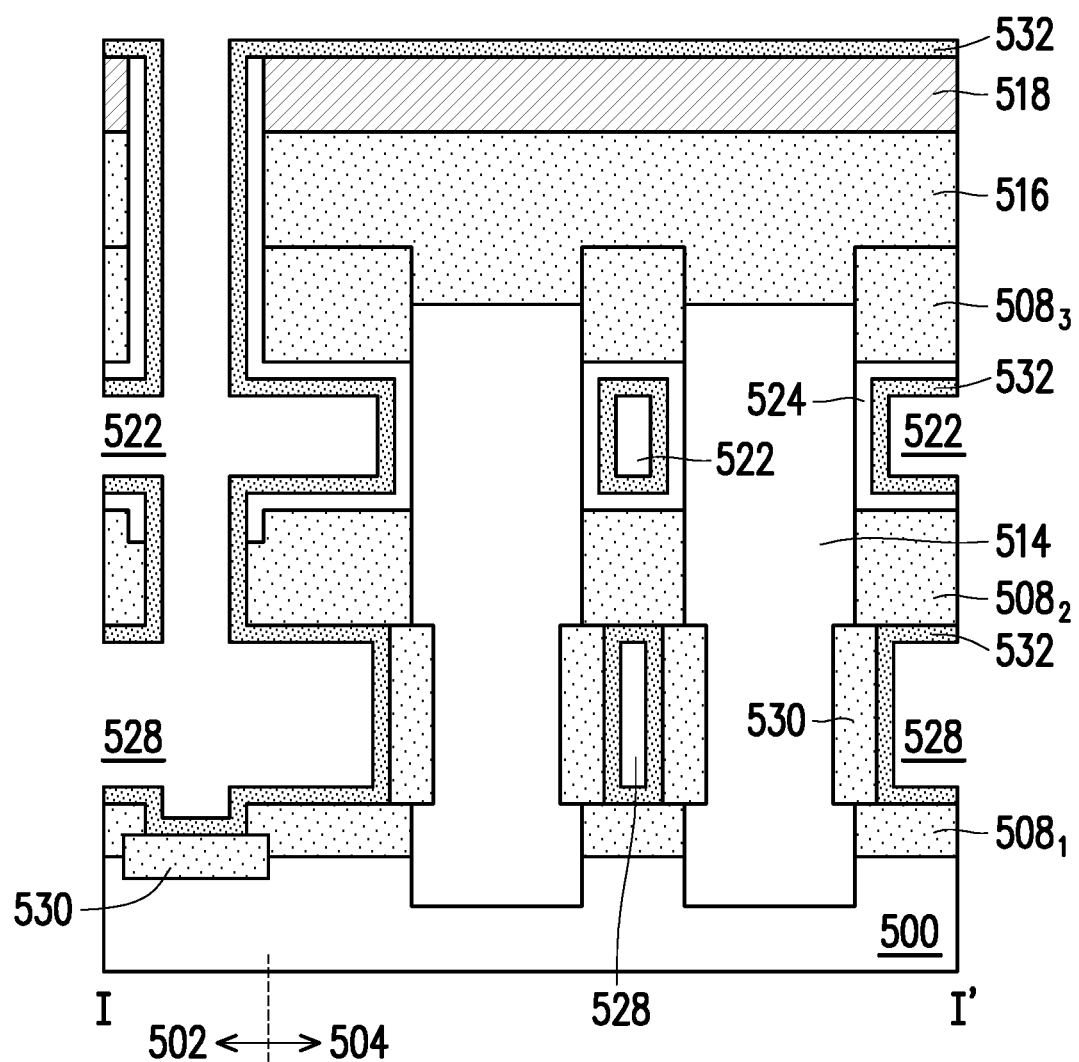
Figure 5N:
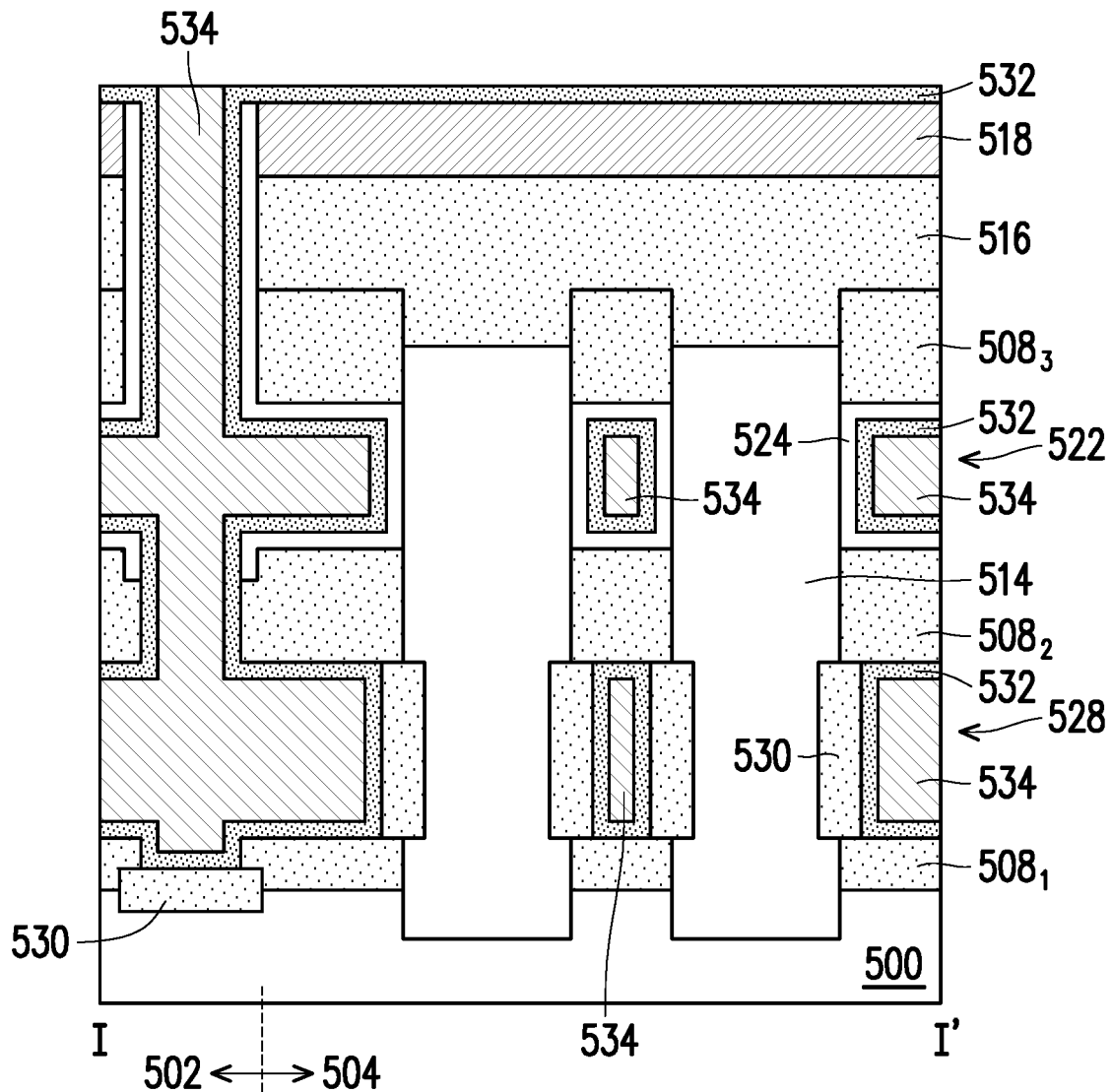
Figure 50:
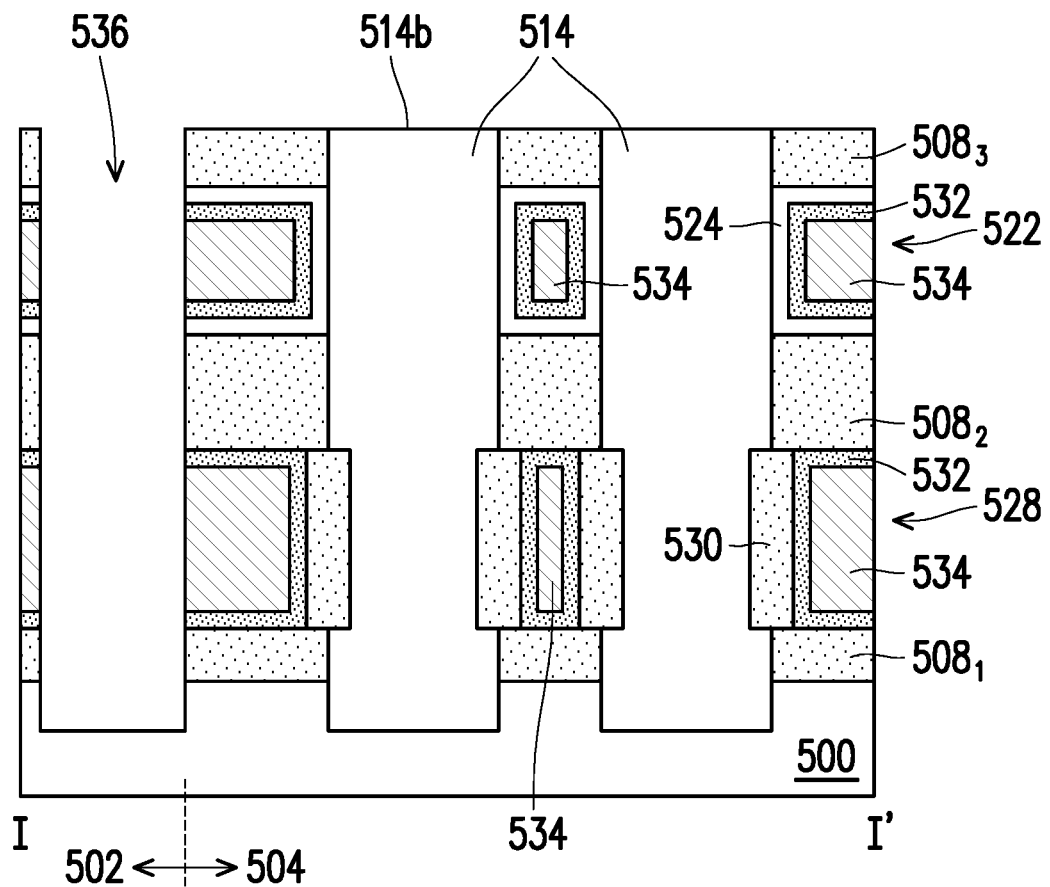
Figure 5P:
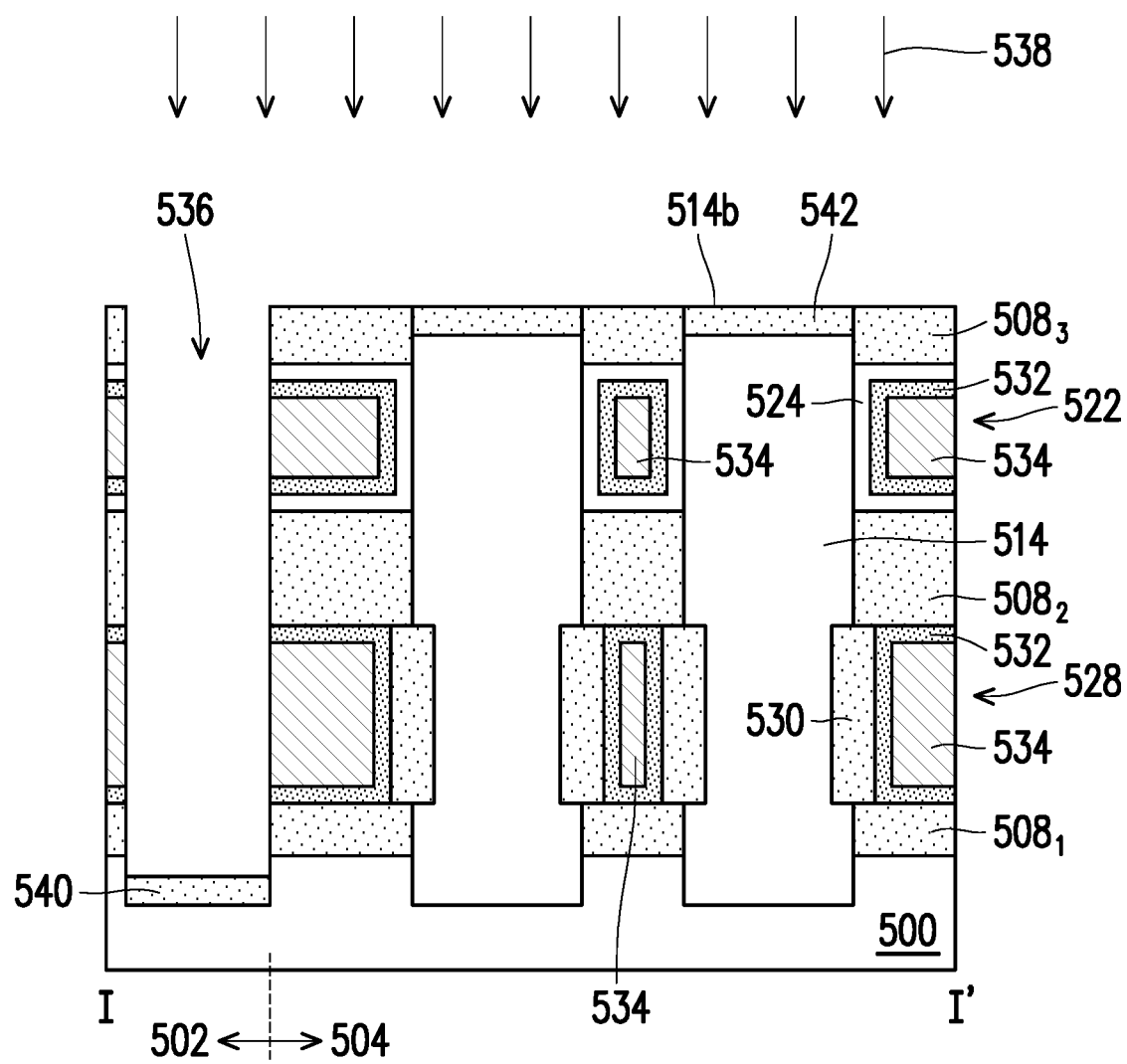
Figure 5Q:
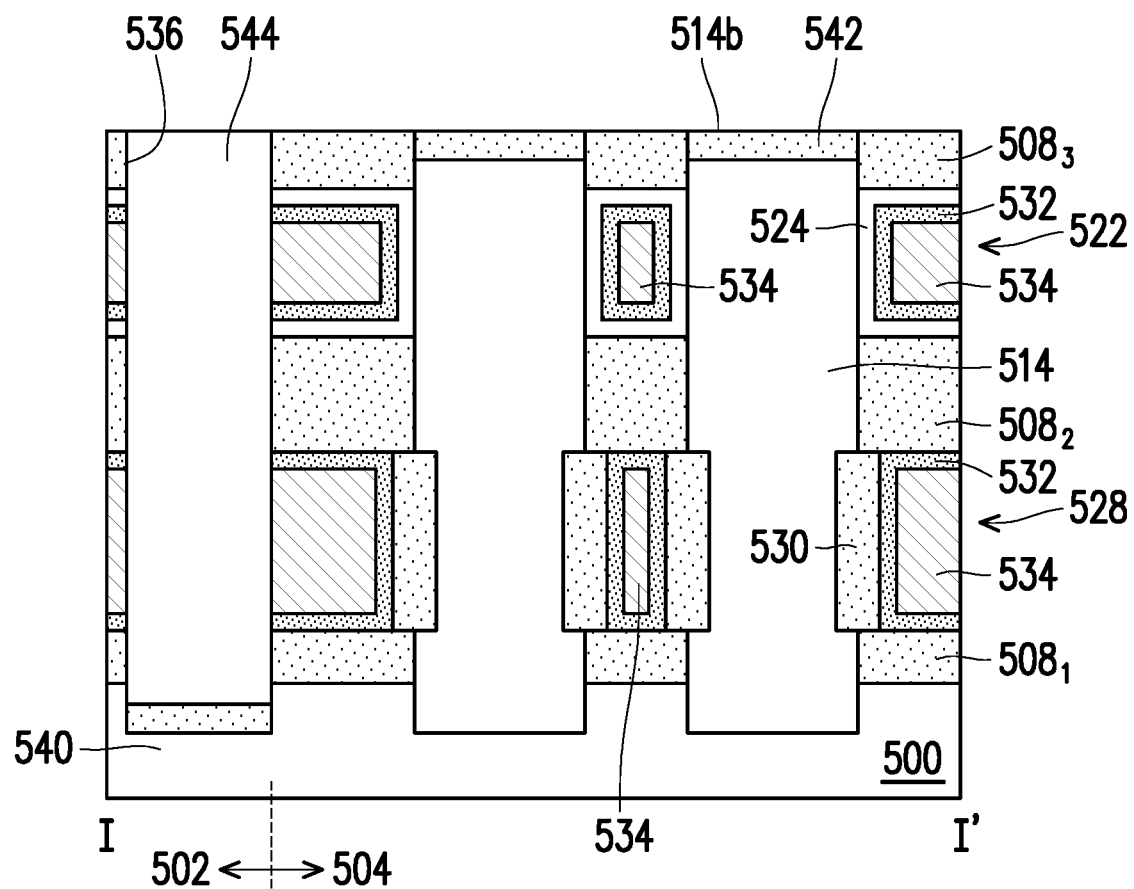
Figure 5R:
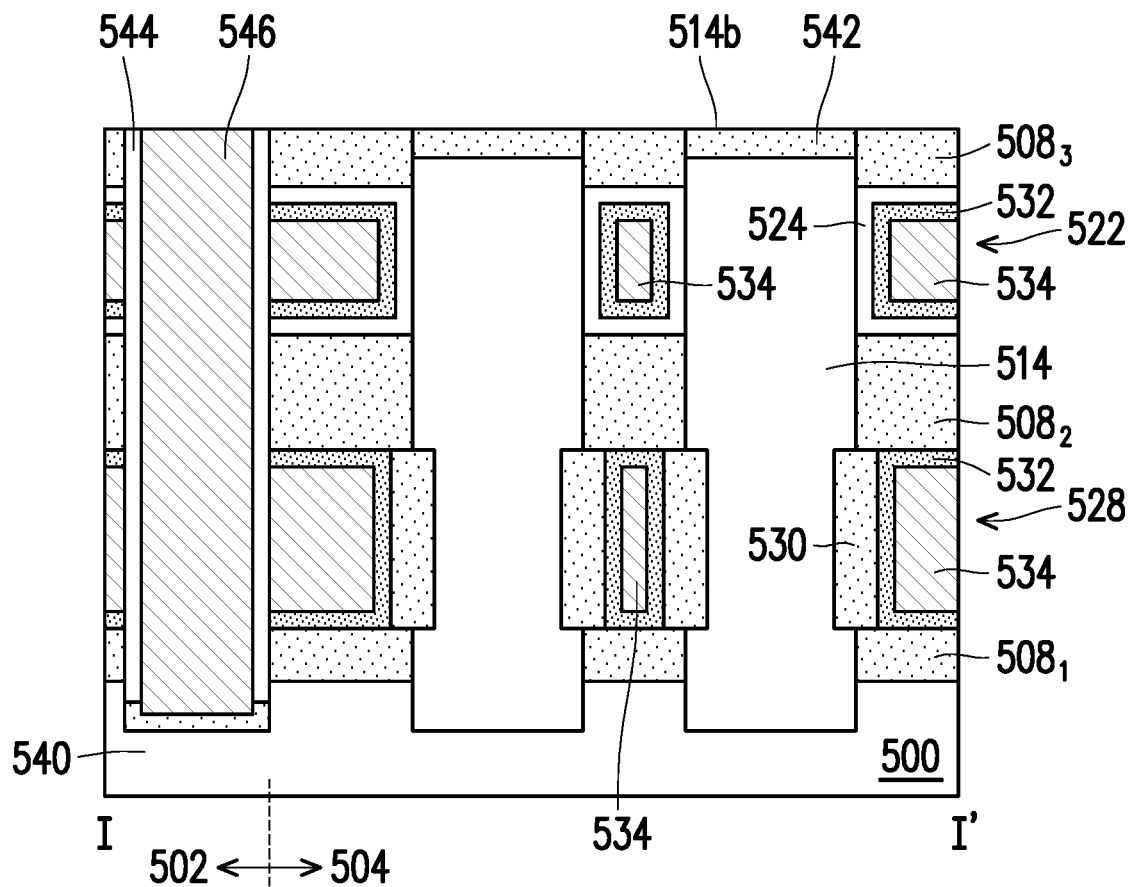

FIG. 5A to FIG. 5R are cross-sectional views of a manufacturing process of a 3D memory device according to the second embodiment of the disclosure.

Please refer to FIG. 5A first, a substrate 500 is provided, which has a CSL region 502 and a memory cell region 504, and the present embodiment may be obtained by referring to FIG. 1. The CSL region 502 of the substrate 500 and the memory cell region 504 are actually a plurality of regions that are alternately arranged along the first direction in parallel. That is to say, the CSL region 502 is a region in which the CSLs are to be subsequently formed (see 108 in FIG. 1), and the memory cell region 504 is a region in which the memories are to be subsequently formed (see 110 in FIG. 1). Then, a stacked structure 506 is formed on the substrate 500, and the stacked structure 506 includes N+1 layers of a first material layer and N layers of a second material layer alternated with each other, wherein N is an integer greater than 1. For example, as shown in FIG. 5A, the stacked structure 506 formed by three first material layers $508_1$, $508_2$, and $508_3$ and two second material layers $510_1$ and $510_2$ is shown. However, the disclosure is not limited thereto, and other intermediate layers may be provided in the stacked structure 506 to facilitate the following processes.

Next, referring to FIG. 5B, a plurality of through holes 512 are formed in the stacked structure 506 on the memory cell region 504 until the substrate 500 is exposed. In the present embodiment, a bottom portion 512a of the through holes 512 may be lower than a top surface 500a of the substrate 500. However, the disclosure is not limited thereto; in another embodiment, the bottom portion 512a of the through holes 512 may be level with the top surface 500a of the substrate 500. After the through holes 512 are formed, a P-type ion implantation process 513 may be additional performed to adjust the threshold voltage (Vt) of the GSL subsequently formed.

Then, referring to FIG. 5C, a plurality of epitaxial pillars 514 are grown from the substrate 500 through the through holes 512. For example, if the substrate 500 is a silicon substrate, then the epitaxial pillars 514 formed by epitaxy may be (single crystal) silicon epitaxial pillars. In the present embodiment, the forming method of the epitaxial pillars 514 may adopt an existing epitaxial process.

Next, referring to FIG. 5D, in order to form a plurality of slits in the stacked structure 506 on the CSL region 502, a third material layer 516 may first be comprehensively formed on the substrate 500, and the forming method may be forming a film layer covering the epitaxial pillars 514 on the stacked structure 506 using a deposition or coating method. The third material layer 516 may be the same material as the first material layer $508_3$ to facilitate a subsequent process. However, the disclosure is not limited thereto, and the material of the third material layer 516 may be different from the first material layer $508_3$. For the flatness of the surface, a planarization process such as CMP may further be performed after the third material layer 516 is formed.

Next, referring to FIG. 5E, a hard mask layer 518 is formed on the third material layer 516, wherein the hard mask layer 518 may be used as an etch mask when forming the slits in subsequent etching, so a material with an etch selectivity much lower than that of the stacked structure 506 is preferred. In an embodiment, the material of the hard mask layer 518 is polysilicon, the material of the first material layers $508_{1,2,3}$ is, for example, silicon oxide, and the material of the second material layers $510_{1,2}$ is, for example, silicon nitride. However, the disclosure is not limited thereto, and the selection of the above materials may also be changed according to requirements.

Next, referring to FIG. 5F, the hard mask layer 518 is patterned to form an opening 518a in which a slit is to be formed and expose the third material layer 516.

Next, referring to FIG. 5G, using the patterned hard mask layer 518 as an etch mask, the first material layer $508_3$, the topmost second material layer $510_2$, and a portion of the first material layer $508_2$ in the opening 518a are etched and removed, a first slit 520 located on the CSL region 502 is formed, and the topmost second material layer $510_2$ is exposed, wherein the first slit 520 is preferably aligned with the CSL region 502.

Next, referring to FIG. 5H, the topmost second material layer is completely removed to form a first space 522 exposing a portion of each of the epitaxial pillars 514. A method of completely removing the topmost second material layer is, for example, etching, and the etching has high selectivity to the second material layer $510_2$ with respect to the first material layers $508_{2,3}$.

Next, referring to FIG. 5I, a charge-trapping layer 524 is conformally deposited on the surface of the first slit 520 and the surface of each of the exposed epitaxial pillars 514, wherein the charge-trapping layer 524 is, for example, an ONO layer or an ONONO layer. Due to the manufacturing process, in addition to the surface of the epitaxial pillars 514, the charge-trapping layer 524 is also comprehensively formed on the exposed surfaces of other structural layers, such as the surfaces of the hard mask layer 518, the third material layer 516, and the first material layers $508_{2,3}$.

Next, referring to FIG. 5J, a second slit 526 exposing the CSL region 502 is formed under the first slit 502, and the bottommost second material layer $510_1$ is exposed. In an embodiment, the step of forming the second slit 526 includes first etching back the charge-trapping layer 524 until the bottom surface of the first slit 520 is exposed and then performing a lithography process using a mask for forming the first slit 520 until the substrate 500 is exposed. In an embodiment, the step of forming the second slit 526 includes first etching back the charge-trapping layer 524 until the bottom surface of the first slit 520 is exposed, and then etching away the first material layer $508_2$, the bottommost second material layer $510_1$, and the first material layer $508_1$ under the first slit 520 using the remaining charge-trapping layer 524 as an etch mask.

Then, referring to FIG. 5K, the bottommost second material layer is completely removed to form a second space 528 exposing another portion of each of the epitaxial pillars 514. A method of completely removing the bottommost second material layer is, for example, etching, and the etching has high selectivity to the second material layer $510_1$ with respect to the first material layers $508_{1,2}$.

Next, referring to FIG. 5L, a thermal oxidation method is performed to form a thermal oxidation layer 530 on the surface of each of the exposed epitaxial pillars 514 and the surface of the CSL region 502. Since the quality of the thermal oxidation layer 530 is good, the probability of punch through phenomenon may be reduced, wherein the thickness of the thermal oxidation layer 530 is, for example, between 100 nm and 300 nm, and the epitaxial pillars 514 may have a retracted sidewall 514a at the portion in which the thermal oxidation layer 530 is located.

Next, referring to FIG. 5M, a high-k layer 532 is deposited on the surface of the thermal oxidation layer 530 and the surface of the charge-trapping layer 524 exposed in the first space 522 and the second space 528, wherein the method in which the high-k layer 532 is deposited is, for example, PVD, CVD, ALD, or the like. The material of the high-k layer 532 is, for example, hafnium dioxide ($HfO_2$), titanium dioxide ($TiO_2$), zirconium dioxide ($ZrO_2$), tantalum oxide ($Ta_2O_5$), or aluminum oxide ($Al_2O_3$). Due to the manufacturing process, in addition to the above surfaces, the high-k layer 532 is further comprehensively formed on the exposed surfaces of other structural layers, such as the surfaces of the hard mask layer 518 and the first material layers $508_{1,2}$.

Next, referring to FIG. 5N, a metal material 534, such as tungsten, is deposited in the first space 522 and the second space 528.

Next, referring to FIG. 5O, a third slit 536 cutting off the metal material 534 is formed at the positions of the original first slit (see 520 in FIG. 5J) and the second slit (see 526 in FIG. 5J), and the substrate 500 is exposed, wherein the metal material 534 left in the first space 528 may be used as a WL, and the metal material left in the second space 528 may be used as a GSL. Moreover, the step of forming the third slit 536 may be performed by a lithography process using a mask for forming the first slit until the substrate 500 is exposed. In addition, before the third slit 536 is formed by etching, the hard mask layer (see 518 in FIG. 5N), the third material layer (see 516 in FIG. 5N), and a portion of the stacked structure 506 (as the material layer $508_3$) may first be optionally removed until a top surface 514b of the epitaxial pillars 514 is exposed. However, the disclosure is not limited thereto, and the film layer may be removed in a subsequent process after the third slit 536 is formed.

Next, referring to FIG. 5P, an ion implantation process 538 is performed to form a plurality of CSLs 540 in the exposed substrate 500. At the same time, if the top surface 514b of the epitaxial pillars 514 is exposed, then a doped region 542 may be formed on the top surface 514b of each of the epitaxial pillars 514 during the ion implantation process 538, which may help improve conductivity during subsequent electrical contact.

Then, referring to FIG. 5Q, an insulating layer 544 is deposited in the third slit 536, wherein the method for depositing the insulating layer 544 is, for example, low-temperature oxidation.

Next, referring to FIG. 5R, CSL contacts 546 are formed in the insulating layer 544 to connect the CSLs 540, wherein the CSL contacts 546 are formed by, for example, first forming an opening exposing the CSLs 540 by etching in the insulating layer 544, and then depositing a metal material (such as tungsten) in the opening until completely full, and then performing a metal planarization step such as CMP to obtain the CSL contacts 546. It may be obtained by comparing with FIG. 1 that, the CSL contacts (see 104 indicated in FIG. 1) are arranged along the second direction, and each of the CSLs (see 108 indicated in FIG. 1) has at least one CSL contact to be connected by the same circuit CSL. Since the CSL contacts 546 of the present embodiment are connected to the CSLs 540 in the substrate 500 by a deposition process, the 3D memory device of the disclosure may achieve by-bit erase operation.

The circuit and the operation thereof of the 3D memory device of the disclosure are described below.

First, with regard to the PGM (programming) operation of the 3D memory device, common methods may be adopted, such as using +Vg FN injection or channel-hot-electron injection to perform PGM on selected memory cells.

Figure 6:
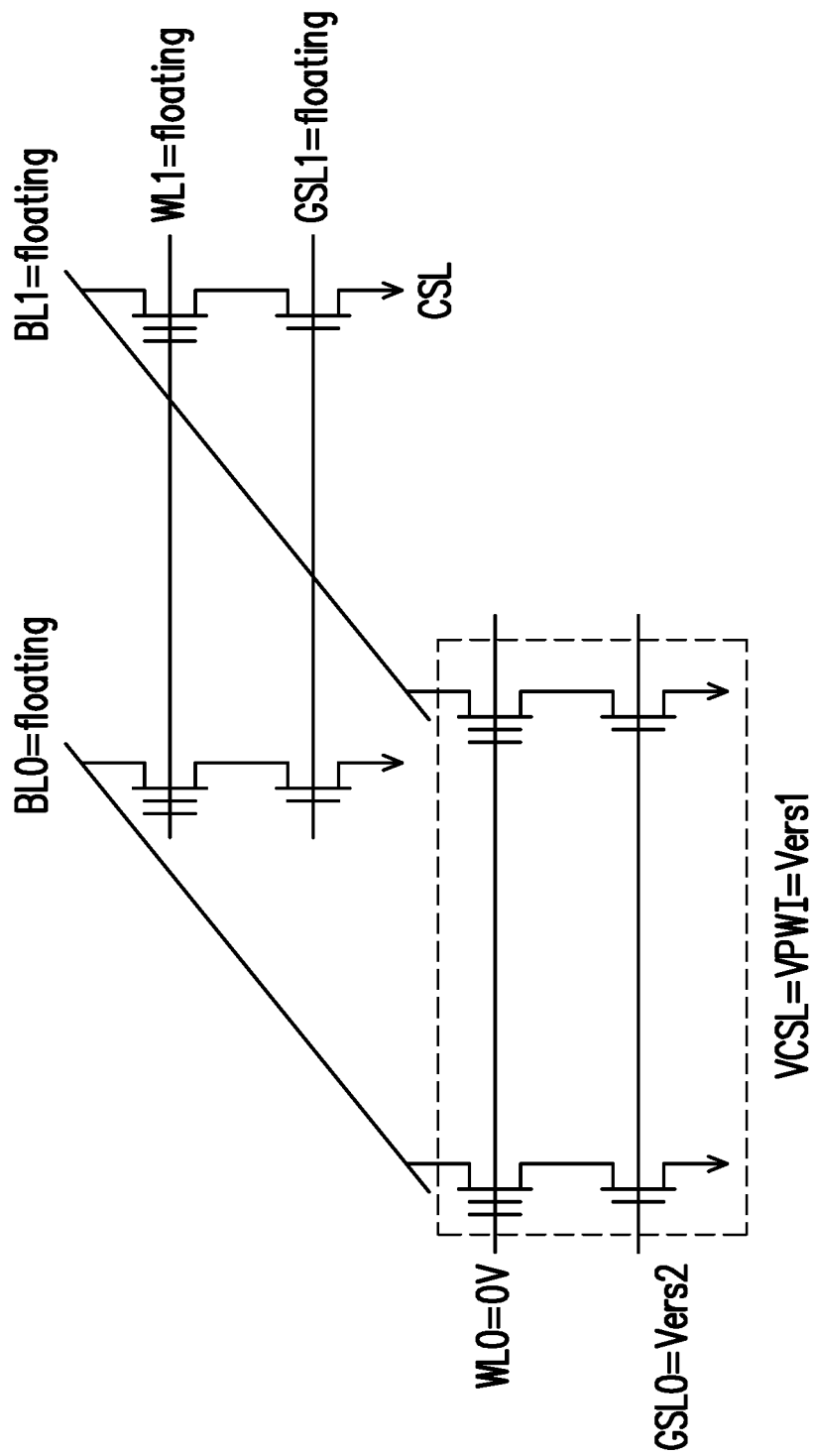
FIG. 6 is a circuit diagram of a 3D memory device during an erase operation according to the third embodiment of the disclosure.

Regarding the ERS (erase) operation of the 3D memory device, there are two ways. FIG. 6 shows an erase operation of the 3D memory device on selectable WL and FIG. 7 shows an erase operation of the 3D memory device on selectable bit.

In FIG. 6, two WLs are respectively connected to four NOR flash memories. To erase the two NOR flash memories framed by dashed lines, an erase voltage Vers1 may be supplied to the CSLs and an erase voltage Vers2 may be supplied to GSL0, wherein WL0 is 0 V, and the remaining circuits are kept floating to complete by-page erase operation.

Figure 7:
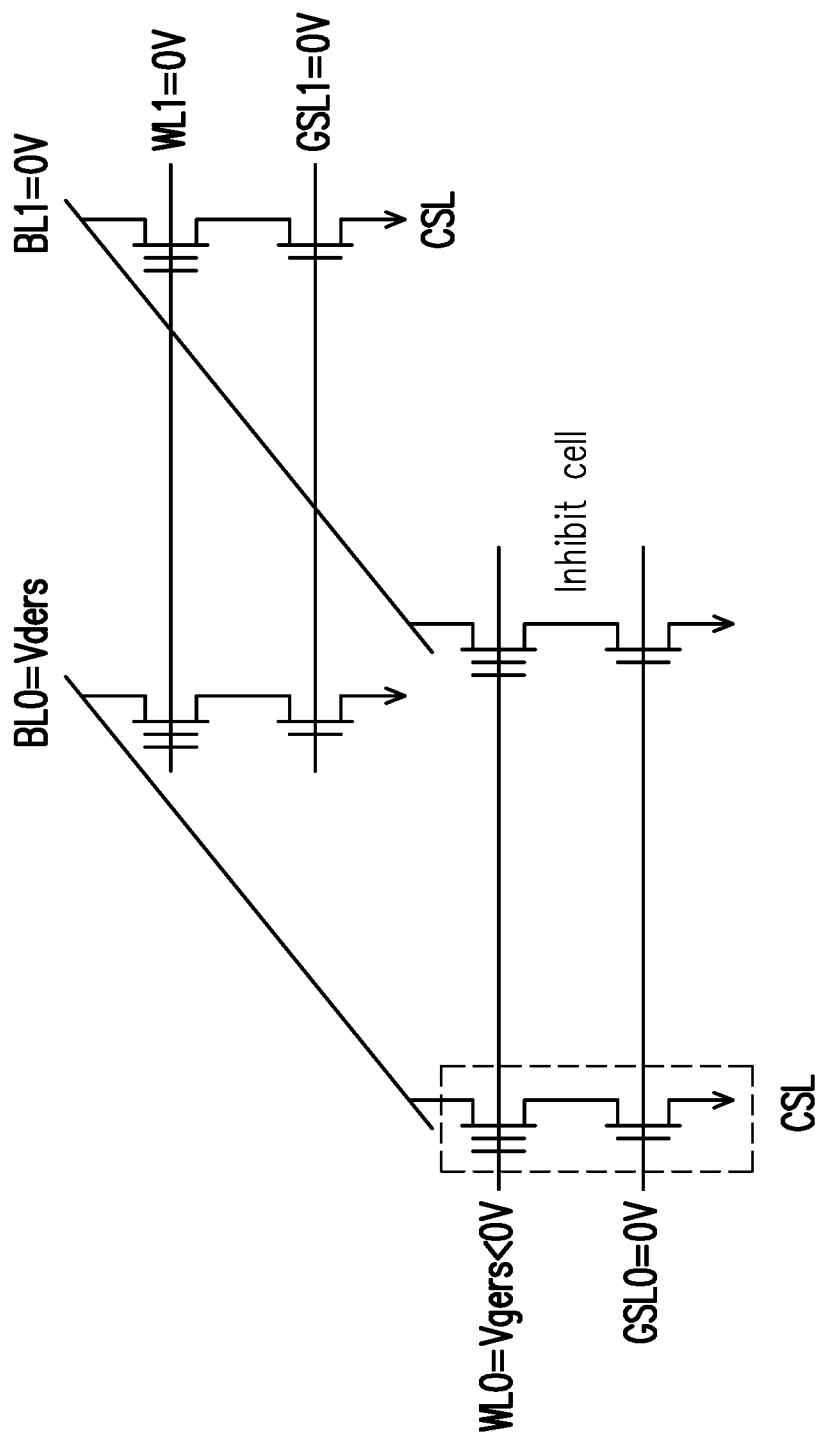
FIG. 7 is another circuit diagram of the 3D memory device during the erase operation according to the third embodiment of the disclosure.

In FIG. 7, in order to erase a single NOR flash memory framed by dashed lines, an erase voltage Vgers of less than 0 V may be supplied to WL0 and an erase voltage Vders may be supplied to BL0, and the remaining circuits are 0 V to complete by-bit erase operation.

Figure 8:
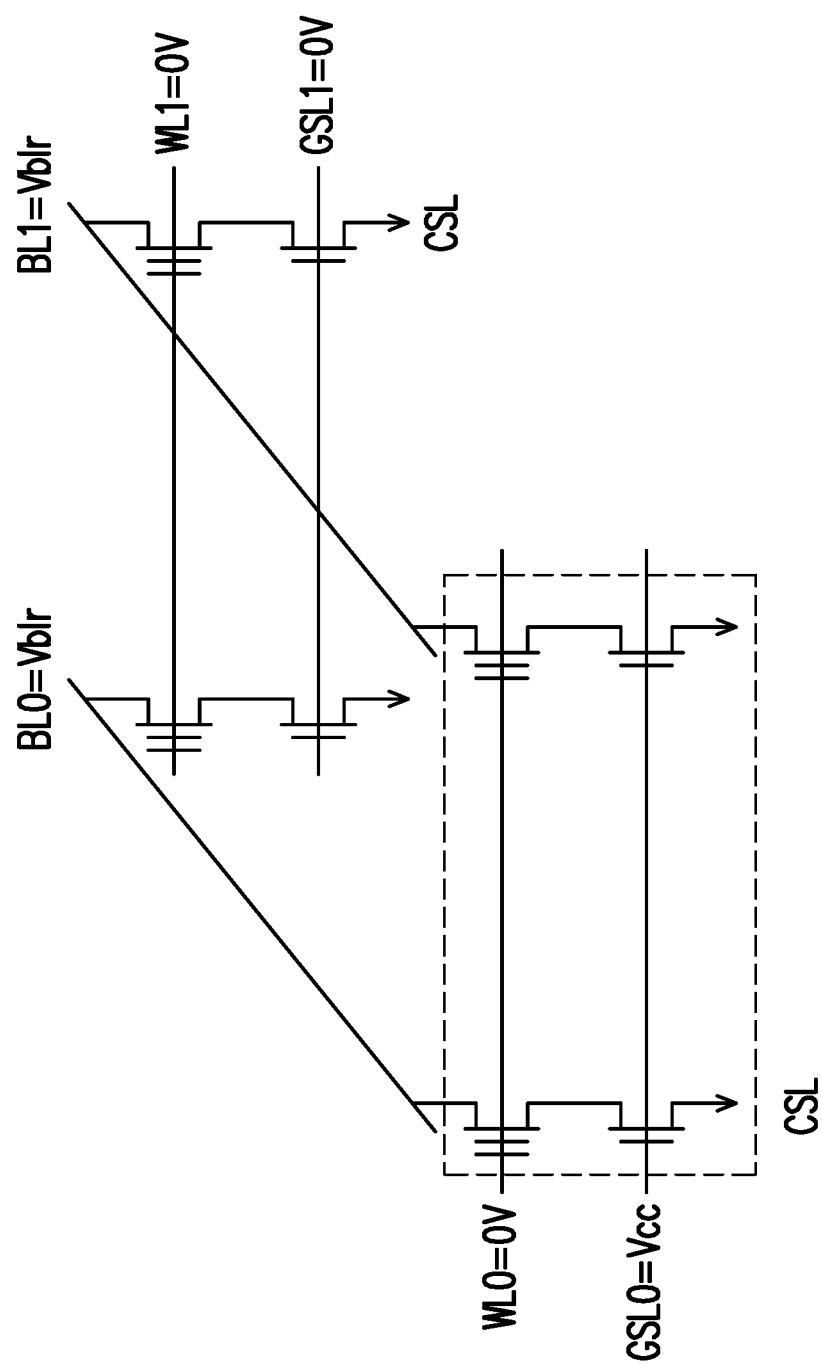
FIG. 8 is a circuit diagram of a 3D memory device during a read operation according to the fourth embodiment of the disclosure.

The read operation of the 3D memory device is shown in FIG. 8.

FIG. 8 shows a low-power read operation. The dashed line frames the memory cells to be read. WL1 and GSL1 of the unselected cells are both 0 V. WL0 of the selected cells is 0 V (wherein low threshold voltage LVt<0 V and high threshold voltage HVt>0 V), Vcc is supplied to GSL0 without pumping circuit, and voltages supplied to BL0 and BL1 are both read voltage Vblr.

Based on the above, in the disclosure, the NOR flash memory array is changed into a vertical 3D memory device, which may not only reduce the area of the memory cells, but a high-k material may also be added as a blocking dielectric layer and a bandgap engineered tunnel dielectric layer in the NOR flash memories via process improvements. In addition, the manufacturing method of the disclosure may provide a high-quality insulating layer between the GSL and the epitaxial channel to prevent the occurrence of punch through phenomenon. The gate (WL) may also be formed by depositing a metal to improve the performance of memory cells.

Although the disclosure has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:
1. A 3D memory device, comprising:
a substrate having a plurality of common source lines (CSLs) and a plurality of memory cell regions alternately arranged along a first direction in parallel;
a plurality of stacked structures formed on the plurality of memory cell regions of the substrate, and each of the stacked structures comprises a ground select line (GSL) layer electrically isolated from the substrate and a word line (WL) layer electrically isolated from the GSL and formed thereon;
a plurality of CSL contacts formed on the plurality of CSLs of the substrate along a second direction to connect each of the CSLs; and a plurality of NOR flash memories passing through the stacked structures and disposed in the plurality of memory cell regions, and each of the NOR flash memories comprises:
  an epitaxial pillar formed from the substrate, and the epitaxial pillar has a retracted sidewall at a portion passing through the GSL layer;
  a charge-trapping layer located between the epitaxial pillar and the WL layer in the stacked structure;
  a high-k layer located between the charge-trapping layer and the WL layer; and
  a first insulating layer located between the retracted sidewall of the epitaxial pillar and the GSL layer.

2. The 3D memory device of claim 1, wherein each of the CSL contacts is in direct contact with the CSL.

3. The 3D memory device of claim 1, wherein the charge-trapping layer surrounds the epitaxial pillar and is extended to an upper surface and a lower surface of the WL layer.

4. The 3D memory device of claim 1, further comprising a second insulating layer formed between the CSL contacts and the stacked structures.

5. The 3D memory device of claim 1, further comprising a plurality of first conductivity type doped regions formed in a top surface of the epitaxial pillar.

6. The 3D memory device of claim 1, further comprising a plurality of second conductivity type doped regions formed in the substrate under the epitaxial pillar.

7. The 3D memory device of claim 1, wherein there is an angle between the first direction and the second direction.

8. The 3D memory device of claim 1, wherein the first direction is perpendicular to the second direction.

9. The 3D memory device of claim 1, wherein the substrate is a silicon substrate and the epitaxial pillar is a silicon epitaxial pillar.

10. A method of manufacturing a 3D memory device, comprising:
  providing a substrate having a plurality of common source line (CSL) regions and a plurality of memory cell regions alternately arranged along a first direction in parallel;
  forming a stacked structure on the substrate, wherein the stacked structure comprises N+1 layers of a first material layer and N layers of a second material layer alternated with each other, and N is an integer greater than 1;
  forming a plurality of through holes in the stacked structure on the plurality of memory cell regions until the substrate is exposed;
  growing a plurality of epitaxial pillars from the substrate through the plurality of through holes;
  forming a plurality of first slits in the stacked structure on the plurality of CSL regions and exposing a topmost second material layer, wherein each of the first slits is aligned with each of the CSL regions;
  completely removing the topmost second material layer to form a first space exposing a portion of each of the epitaxial pillars;
  depositing a charge-trapping layer conformally on a surface of the plurality of first slits and a surface of each of the epitaxial pillars exposed;
  forming a plurality of second slits exposing the plurality of CSL regions under the plurality of first slits and exposing a bottommost second material layer;
  completely removing the bottommost second material layer to form a second space exposing another portion of each of the epitaxial pillars;
  performing a thermal oxidation method to form a thermal oxidation layer on the surface of each of the epitaxial pillars exposed and a surface of the plurality of CSL regions;
  depositing a high-k layer on a surface of the thermal oxidation layer and a surface of the charge-trapping layer exposed in the first space and the second space;
  depositing a metal material in the first space and the second space;
  forming a plurality of third slits cutting off the metal material at positions of the original first slits and second slits and exposing the substrate, wherein the metal material located in the first space is used as a word line (WL) and the metal material located in the second space is used as a ground select line (GSL);
  performing an ion implantation process to form a plurality of CSLs in the exposed substrate;
  depositing an insulating layer in the plurality of third slits; and
  forming a plurality of CSL contacts in the insulating layer, and the plurality of CSL contacts are respectively connected along a second direction.

* * * * *